United States Patent
Nishimura et al.

(10) Patent No.: US 9,691,643 B2
(45) Date of Patent: Jun. 27, 2017

(54) ETCHING APPARATUS

(71) Applicant: Tokyo Electron Limited, Tokyo (JP)

(72) Inventors: Eiichi Nishimura, Miyagi (JP); Tadashi Kotsugi, Miyagi (JP); Fumiko Yamashita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 396 days.

(21) Appl. No.: 14/499,341

(22) Filed: Sep. 29, 2014

(65) Prior Publication Data

US 2015/0013908 A1  Jan. 15, 2015

Related U.S. Application Data

(62) Division of application No. 13/746,632, filed on Jan. 22, 2013, now Pat. No. 8,877,081.

(Continued)

(30) Foreign Application Priority Data

Jan. 23, 2012 (JP) ................................. 2012-011202

(51) Int. Cl.
*H01L 21/32* (2006.01)
*H01L 21/3065* (2006.01)
(Continued)

(52) U.S. Cl.
CPC ........ *H01L 21/67069* (2013.01); *B82Y 10/00* (2013.01); *B82Y 40/00* (2013.01);
(Continued)

(58) Field of Classification Search
CPC .................... H01J 37/32091; B81C 2201/0149
See application file for complete search history.

(56) References Cited

U.S. PATENT DOCUMENTS

2003/0155075 A1  8/2003  Yasui et al.
2008/0085601 A1*  4/2008  Park .................... H01L 21/0337
                                                          438/637
(Continued)

FOREIGN PATENT DOCUMENTS

CN      101443371       5/2009
JP      2003-332321     11/2003
(Continued)

OTHER PUBLICATIONS

Ting et al. Plasma etch removal of poly(methyl methacrylate) in block copolymer lithography, 2008, Journal of Vacuum Science & Technology B 26(5), pp. 1684-1689.

(Continued)

*Primary Examiner* — Gordon R Baldwin
*Assistant Examiner* — Aiden Lee
(74) *Attorney, Agent, or Firm* — IPUSA, PLLC

(57) ABSTRACT

An etching apparatus includes a controller configured to control a high frequency power supply to supply a high frequency power to a mounting table for etching a polymer layer formed on a base layer placed on the mounting table, using plasma generated from a predetermined gas supplied from a gas supply source by the high frequency power, the polymer layer having a periodic pattern of a first polymer and a second polymer formed by self-assembling the first polymer and the second polymer of a block copolymer that is capable of being self-assembled, the high frequency power being set for etching the polymer layer using the generated plasma such that the second polymer is removed and a pattern of the first polymer is formed for subsequently etching the base layer using the pattern of the first polymer as a mask.

8 Claims, 18 Drawing Sheets

Related U.S. Application Data

(60) Provisional application No. 61/590,936, filed on Jan. 26, 2012.

(51) Int. Cl.
    *H01L 21/67*     (2006.01)
    *H01L 21/033*     (2006.01)
    *H01L 21/311*     (2006.01)
    *H01J 37/32*     (2006.01)
    *H01L 21/027*     (2006.01)
    *G03F 7/00*     (2006.01)
    *B82Y 10/00*     (2011.01)
    *B82Y 40/00*     (2011.01)

(52) U.S. Cl.
    CPC ...... *G03F 7/0002* (2013.01); *H01J 37/32009* (2013.01); *H01J 37/32091* (2013.01); *H01J 37/32155* (2013.01); *H01J 37/32706* (2013.01); *H01L 21/0271* (2013.01); *H01L 21/0332* (2013.01); *H01L 21/0337* (2013.01); *H01L 21/3065* (2013.01); *H01L 21/31138* (2013.01); *H01J 2237/3343* (2013.01); *H01J 2237/3348* (2013.01)

(56) References Cited

U.S. PATENT DOCUMENTS

| | | |
|---|---|---|
| 2009/0074958 A1 | 3/2009 | Xiao |
| 2009/0253867 A1 | 10/2009 | Takahashi et al. |
| 2010/0140221 A1* | 6/2010 | Kikuchi ............ H01J 37/32091 216/67 |
| 2010/0213162 A1 | 8/2010 | Mochiki et al. |
| 2011/0034029 A1 | 2/2011 | Matsunaga et al. |
| 2011/0117744 A1 | 5/2011 | Ito |
| 2012/0273341 A1* | 11/2012 | Agarwal ............ H01J 37/32082 204/164 |

FOREIGN PATENT DOCUMENTS

| | | |
|---|---|---|
| JP | 2007-516622 | 6/2007 |
| JP | 2007-208255 | 8/2007 |
| JP | 2009-292703 | 12/2009 |
| JP | 2010-269304 | 12/2010 |
| JP | 2011-035233 | 2/2011 |
| JP | 2012-005939 | 1/2012 |
| TW | 200925670 | 6/2009 |
| TW | 201126573 | 8/2011 |
| WO | 2005-062885 | 7/2005 |

OTHER PUBLICATIONS

Liu Chi-Chun et al. Pattern transfer using poly(styrene-block-methyl methacrylate) copolymer films and reactive ion etching, 2007, Journal of Vacuum Science and Technology B 25(6), pp. 1963-1968.

* cited by examiner

POLYMER LENGTH: A=B

FIG.6B
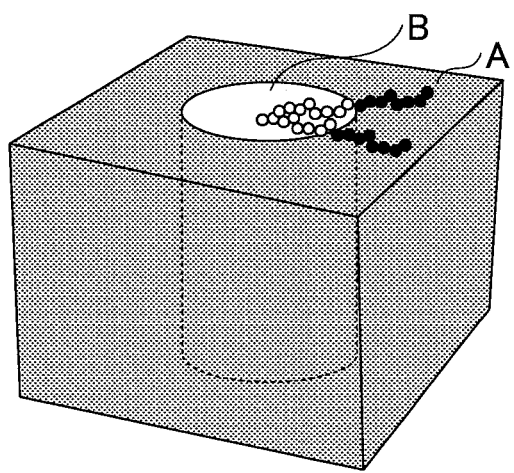
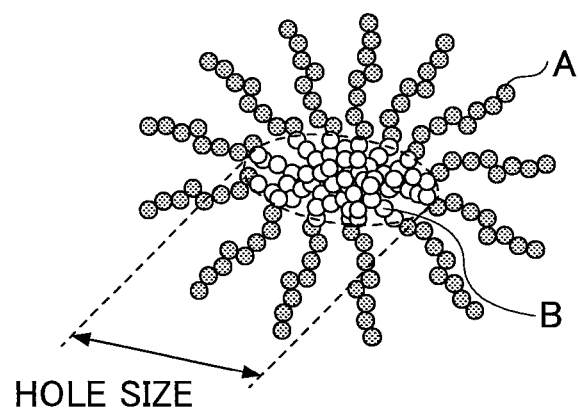
HOLE SIZE
POLYMER LENGTH: A>B

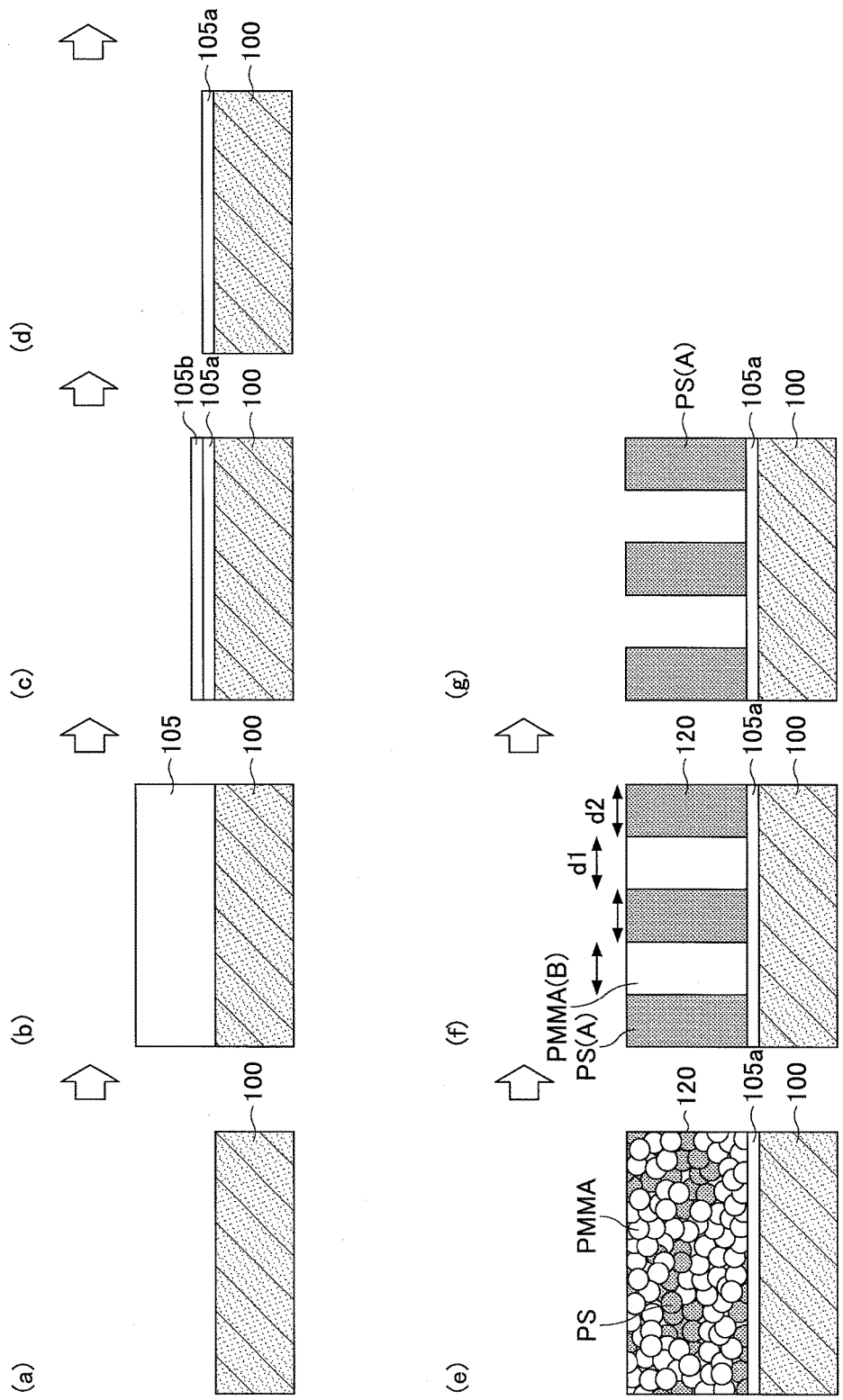

FIG.16C

|  | ΔE<br>He ION<br>(VALUE IN<br>DOCUMENT) | ΔE<br>O ION<br>(CALCULATED<br>VALUE) |
|---|---|---|
| 30MHz | 70 | 35 |
| 60MHz | 35 | 17.5 |
| 100MHz | 20 | 10 |
|  | eV | eV |

ETCHING APPARATUS

CROSS-REFERENCE TO RELATED APPLICATION

This application is a divisional application of U.S. patent application Ser. No. 13/746,632 filed on Jan. 22, 2013, which claims the benefit of priority of Japanese Patent Application No. 2012-011202 filed on Jan. 23, 2012, and U.S. provisional application No. 61/590,936 filed on Jan. 26, 2012, where the entire contents of these applications are incorporated herein by reference.

BACKGROUND OF THE INVENTION

1. Field of the Invention

The present disclosure relates to an etching apparatus.

2. Description of the Related Art

In order to achieve higher level of miniaturization of semiconductor devices, a critical dimension (CD) obtained by microprocessing with the conventional photolithography needs to be further reduced. For this purpose, EUV (Extreme Ultraviolet) as a next-generation exposure technology is under development. In EUV, since a very short wavelength of, e.g., about 13.5 nm is used, a wavelength of a EUV light source is remarkably shorter than a wavelength of a conventional UV light source. Accordingly, there is a technical barrier to mass production, and a problem such as a longer light exposure time is yet to be solved. Thus, it is required to develop a manufacturing method for a further miniaturized semiconductor device before developing the next-generation exposure technology of EUV.

In this regard, in Patent Document 1, attention is brought to self-assembled block copolymer (BCP) as one of self-assembled materials capable of forming organized patterns by themselves. Specifically, a block copolymer layer, which includes a block copolymer containing at least two polymer block components A and B that are not mixed with each other, is coated on a base layer. Thereafter, as heat-treatment (annealing) is performed, the polymer block components A and B are phase-separated by themselves. With this, a self-assembled pattern of components A and B is formed on a surface of a substrate. Further, in Patent Document 2, in order to achieve miniaturization equal to or less than about 22 nm, there is proposed using a self-assembled pattern of a block copolymer as a via forming method for obtaining an appropriate uniform CD (critical dimension) at a narrower pitch.

As mentioned above, a dimension of the structural unit within the self-assembled pattern of the block copolymer is typically within 10 nanometers order which has been very difficult to achieve in the conventional photolithography.

However, it is difficult to appropriately selectively remove such a fine structural. It means that if one of the structural unit is removed by etching, a processing accuracy error by etching may become greater than a self-assembly error in, e.g., CD value of an opening. As a result, non-uniformity in the dimension of a finally obtained etching pattern as a mask may be outside an allowable range.

Patent Document 1: Japanese Patent Laid-open Publication No. 2007-208255

Patent Document 2: Japanese Patent Laid-open Publication No. 2010-269304

SUMMARY OF THE INVENTION

In view of the foregoing problems, embodiments provide an etching method and an etching apparatus capable of optimizing etching conditions for a periodic pattern formed by self-assembly of a block copolymer.

In accordance with one aspect of an embodiment, there is provided an etching apparatus including a processing chamber in which a mounting table configured as a lower electrode is placed; a high frequency power supply configured to supply a high frequency power into the processing chamber; a gas supply source configured to supply a predetermined gas into the processing chamber; and a controller configured to control the high frequency power supply to supply a high frequency power to the mounting table for etching a polymer layer formed on a base layer placed on the mounting table, using plasma generated from the predetermined gas supplied from the gas supply source by the high frequency power, the polymer layer having a periodic pattern of a first polymer and a second polymer formed by self-assembling the first polymer and the second polymer of a block copolymer that is capable of being self-assembled, the high frequency power being set such that a great amount of ion energy is distributed within a range smaller than ion energy distribution at which an etching yield of the first polymer is generated and larger than or equal to ion energy distribution at which an etching yield of the second polymer is generated by setting the frequency of the high frequency power to be higher than or equal to 60 MHz, for etching the polymer layer using the generated plasma such that the second polymer is removed and a pattern of the first polymer is formed for subsequently etching the base layer using the pattern of the first polymer as a mask.

BRIEF DESCRIPTION OF THE DRAWINGS

FIGS. 6A and 6B are diagrams for explaining applying a phase-separation structure of the polystyrene PS and the methyl methacrylate PMMA to a semiconductor pattern;

FIG. 7 is a diagram for explaining a process of selectively etching one polymer included in a block copolymer;

FIG. 16C is a diagram showing an ion energy distribution of oxygen plasma.

DETAILED DESCRIPTION OF THE PREFERRED EMBODIMENTS

Figure 1:
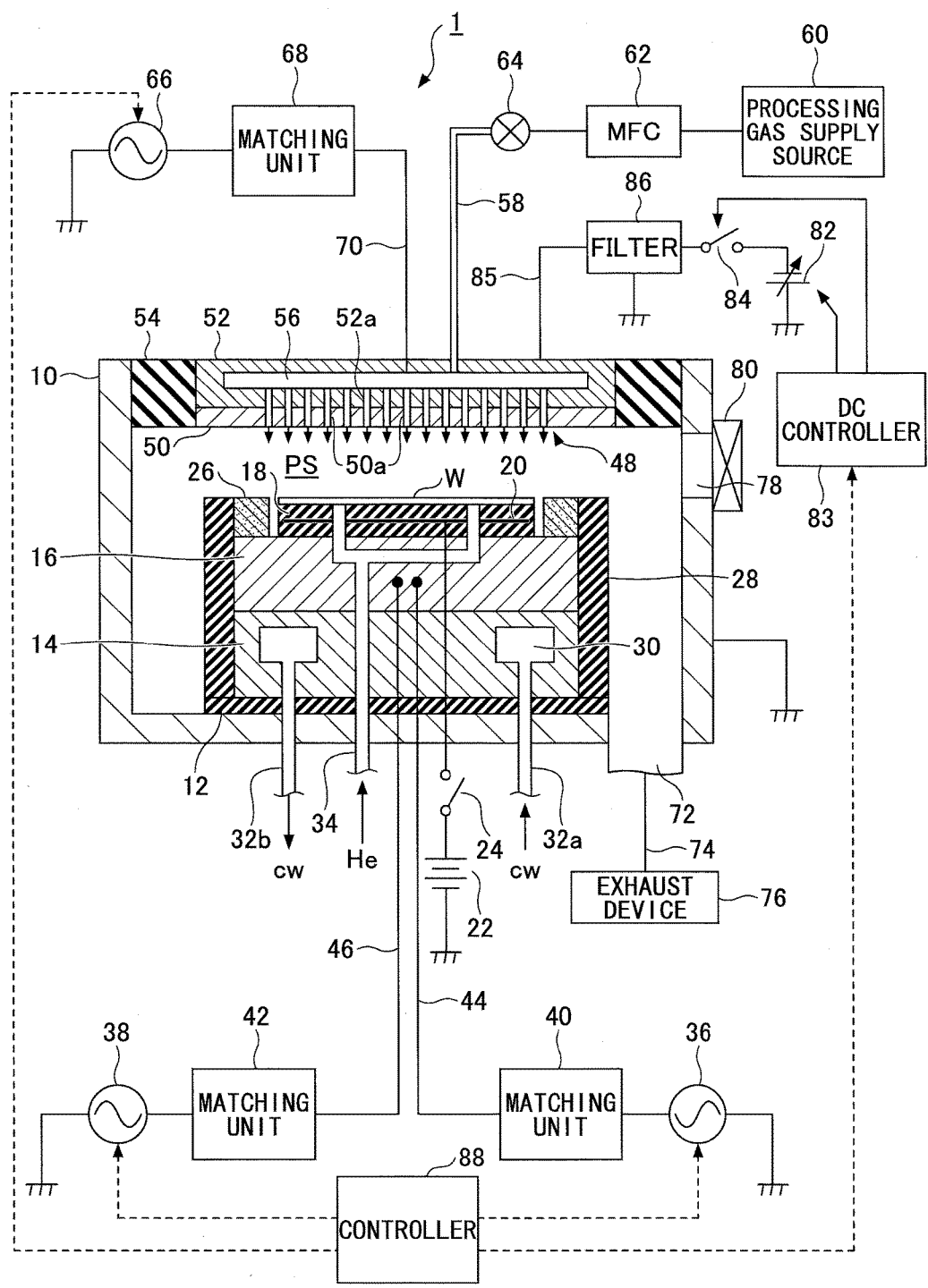
FIG. 1 is a longitudinal cross sectional view showing an overall configuration of a plasma processing apparatus in accordance with an embodiment.

Hereinafter, embodiments will be described with reference to the accompanying drawings. In the specification and drawings, same parts having substantially same configuration and function will be assigned same reference numerals, and redundant description will be omitted.

<Overall Configuration of Plasma Processing Apparatus>

First, an overall configuration of a plasma processing apparatus in accordance with an embodiment will be explained with reference to FIG. 1. FIG. 1 illustrates a configuration of a plasma processing apparatus in accordance with the embodiment. The plasma processing apparatus 1 is configured as a capacitively coupled plasma etching apparatus which applies dual frequency powers to a lower electrode and a single frequency power to an upper electrode. The plasma processing apparatus 1 includes a cylindrical vacuum chamber (processing vessel) 10 made of aluminum having an alumite-treated (anodized) surface, for example. The chamber 10 is grounded.

A cylindrical susceptor support 14 is disposed on an insulating plate 12 such as ceramic at a bottom of the chamber 10. A susceptor 16 made of, e.g., aluminum is placed on the susceptor support 14. The susceptor 16 is configured as a lower electrode, and a processing target object, e.g., a semiconductor wafer W (hereinafter, simply referred to as "wafer W") is mounted on the susceptor 16.

An electrostatic chuck 18 configured to hold the wafer W by an electrostatic attracting force is provided on atop surface of the susceptor 16. The electrostatic chuck 18 includes a pair of insulating layers or insulating sheets; and a chuck electrode 20 therebetween. The chuck electrode 20 is made of a conductive film and is electrically connected to a DC power supply 22 via a switch 24. The wafer W is attracted to and held on the electrostatic chuck 18 by an electrostatic force generated by a DC voltage applied from the DC power supply 22. A focus ring 26 made of silicon, for example, is disposed on the top surface of the susceptor 16 to surround the electrostatic chuck 18 in order to improve in-surface uniformity of etching. A cylindrical inner wall member 28 made of, e.g., quartz is attached to side surfaces of the susceptor 16 and the susceptor support 14.

A coolant cavity or a coolant path 30 extended in, e.g., a circumferential direction of the susceptor support 14 is formed within the susceptor support 14. A coolant of a preset temperature, e.g., cooling water cw is supplied into and circulated through the coolant path 30 via pipelines 32a and 32b from a non-illustrated external chiller unit. A processing temperature of the wafer W on the susceptor 16 can be controlled by adjusting the temperature of the coolant cw. Further, a heat transfer gas such as a He gas is supplied from a non-illustrated heat transfer gas supply device between a top surface of the electrostatic chuck 18 and a rear surface of the wafer W through a gas supply line 34.

A first high frequency power supply 36 for plasma generation is electrically connected to the susceptor 16 via a lower matching unit 40 and a lower power supply rod 44. A second high frequency power supply 38 for ion attraction is also connected to the susceptor 16 via a lower matching unit 42 and a lower power supply rod 46.

The first high frequency power supply 36 outputs a first high frequency power of a relatively high frequency about tens MHz unit, for example, 60 MHz to 100 MHz (or more than that is possible) suitable for plasma generation. Meanwhile, the second high frequency power supply 38 outputs a second high frequency power of a relatively low frequency, for example, 0.8 MHz suitable for attracting ions of plasma on the wafer W on the susceptor 16.

An upper electrode 48 is disposed above the susceptor 16, facing the susceptor 16 in parallel. The upper electrode 48 includes an electrode plate 50 provided with a multiple number of gas holes 50a and made of a semiconductor material such as Si, SiC or the like; and an electrode supporting member 52 that detachably supports the electrode plate 50. The upper electrode 48 is fastened to a top portion of the chamber 10 via a ring-shaped insulator 54. The electrode supporting member 52 is made of a conductive material, e.g., aluminum of which surface is alumite-treated. A plasma generation space or a processing space PS is formed between the upper electrode 48 and the susceptor 16. The ring-shaped insulator 54 is made of alumina ($Al_2O_3$), for example, and hermetically seals a gap between an outer peripheral surface of the upper electrode 48 and a sidewall of the chamber 10, while physically supporting the upper electrode 48 without grounding.

The electrode supporting member 52 has a gas buffer room 56 therein and is provided with a multiple number of gas vent holes 52a for communicating the gas buffer rooms 56 and the gas holes 50a of the electrode plate 50 in a bottom surface thereof. A processing gas supply source 60 is connected to the gas buffer room 56 via a gas supply line 58. A mass flow controller (MFC) 62 and an opening/closing valve 64 are provided on the gas supply line 58. When a certain processing gas is introduced into the gas buffer room 56 from the processing gas supply source 60, the processing gas is then discharged through the gas holes 50a of the electrode plate 50 into the processing space PS toward the wafer W on the susceptor 16 as a shower. In this configuration, the upper electrode 48 also serves as a shower head configured to supply the processing gas into the processing space PS.

A third high frequency power supply 66 for plasma excitation is electrically connected to the upper electrode 48 via an upper matching unit 68 and an upper power supply conductor, e.g., a power supply rod 70. The third high frequency power supply 66 outputs a third high frequency power. Typically, the frequency of the third high frequency power may have a range, e.g., from about 27 MHz to about 300 MHz.

An annular space formed between the susceptor 16 and the susceptor support 14 and the sidewall of the chamber 10 is configured as an exhaust space. An exhaust opening 72 of the chamber 10 is formed at a bottom of the exhaust space. An exhaust device 76 is connected to the exhaust opening 72 via an exhaust line 74. The exhaust device 76 includes a vacuum pump such as a turbo molecular pump and is configured to evacuate an inside of the chamber 10, especially, the processing space PS to a required vacuum level. Further, a gate valve 80 configured to open and close a loading/unloading opening 78 for the wafer W is attached to the sidewall of the chamber 10.

One terminal, i.e., an output terminal of a variable DC power supply 82 provided at an outside of the chamber 10 is electrically connected to the upper electrode 48 via a switch 84 and a DC power supply line 85. The variable DC power supply 82 is configured to output a DC voltage $V_{DC}$ ranging, e.g., from −2000 V to +1000 V, for example. The other terminal of the variable CD power supply 82 is grounded. A polarity and an absolute value of the output (voltage, current) of the variable DC power supply 82 and an on/off operation of the switch 84 are controlled by a DC controller 83 under a control of a controller 88, which will be explained later.

A filter circuit 86 provided on the DC power supply line 85 is configured to apply the DC voltage $V_{DC}$ from the variable DC power supply 82 to the upper electrode 48 while allowing a high frequency power traveling the DC power supply line 85 from the susceptor 16 through the processing space PS and the upper electrode 48 to flow to a ground line so that the high frequency power does not flow to the variable DC power supply 82.

Further, a DC ground member (not shown) made of a conductive material such as Si or SiC, for example, is provided to an appropriate portion in contact with the processing space PS within the chamber 10. The DC ground member is always grounded via a ground line (not shown).

The controller 88 may include a CPU (Central Processing Unit), a ROM (Read Only Memory) and a RAM (Random Access Memory) (not shown). The CPU implements a process according to various types of recipes stored in, e.g., the RAM.

When performing an etching process in this plasma processing apparatus 1 having the above-described configuration, the gate valve 80 is opened, and the wafer W held on a non-illustrated transfer arm is loaded into the chamber 10. The wafer W is then held by a non-illustrated pusher pins, and as the pusher pins are lowered, the wafer W is mounted on the electrostatic chuck 18. After the wafer W is loaded, the gate valve 80 is closed, an etching gas is introduced into the chamber 10 from the processing gas supply source 60 at a certain flow rate and a certain flow rate ratio, and the inside of the chamber 10 is depressurized to a predetermined pressure by the exhaust device 76. Further, high frequency powers of certain power levels are applied to the susceptor 16 from the first high frequency power supply 36, the second high frequency power supply 38 and the third high frequency power supply 66. Further, a DC voltage is applied from the DC power supply 22 to the chuck electrode 20 of the electrostatic chuck 18, so that the wafer W is held on the electrostatic chuck 18. An etching gas introduced as a shower from the shower head is excited into plasma primarily by the high frequency power supplied from the first high frequency power supply 36. A main surface of the wafer W is etched by radicals or ions in the generated plasma. Further, the ions may be attracted toward the wafer W primarily by the high frequency power supplied from the second high frequency power supply 38.

Upon the completion of the plasma etching process, the wafer W is raised upward while held on the pusher pins. Then, after the gate valve 80 is opened, the transfer arm is loaded into the chamber 10. The pusher pin is lowered, and the wafer W is held on the transfer arm. Subsequently, the transfer arm is taken out of the chamber 10, and a next wafer W to be processed is loaded into the chamber 10 by the transfer arm. By repeating this process, wafers W are processed consecutively.

Next, a method of setting an etching condition for etching a self-assembled periodic pattern of a block copolymer in this embodiment is explained in the following.

<Ion Behavior and Ion Energy Distribution>

Here, behavior of ions in plasma will be described. Ions in plasma reach a surface of the wafer W after accelerated by a sheath voltage $V_s(t)$ applied to a sheath region. Here, an acceleration or energy of the incident ions depends on an instantaneous value (absolute value) of the sheath voltage $V_s(t)$ at the moment. That is, the ions e entered an ion sheath when the instantaneous value (absolute value) of the sheath voltage $V_s(t)$ is great reach at the surface of the wafer W with a great acceleration or kinetic energy. Meanwhile, the ions entered the ion sheath when the instantaneous value (absolute value) of the sheath voltage $V_s(t)$ is small reach at the surface of the wafer W with a small acceleration or kinetic energy.

Figure 2:
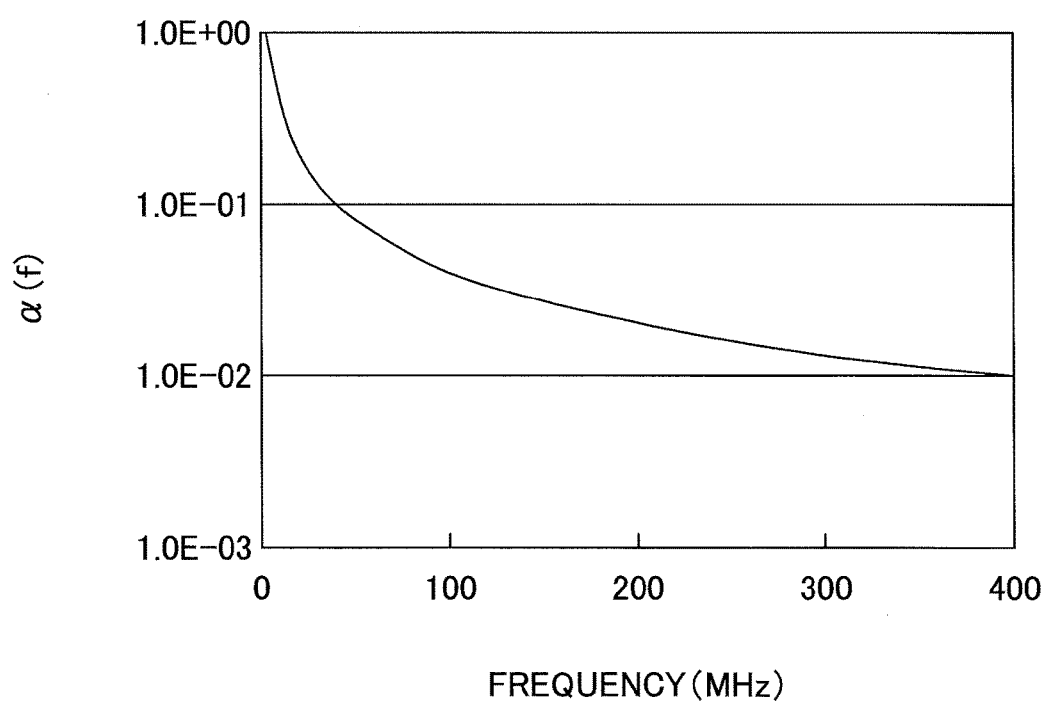
FIG. 2 is a diagram showing a graph showing a transfer function used in the embodiment.

In the ion sheath, the ions respond (make accelerated motion) to the sheath voltage $V_s(t)$ with a certain sensitivity equal to or less than 100%. This response sensitivity or a variable function $\alpha(f)$ varies in inverse proportion to a frequency (f) of a high frequency power used as a RF bias, as shown in FIG. 2, and it is expressed as the following equation (1).

$$\alpha(f) = 1/\{(cf\tau_i)^p + 1\}^{1/p} \tag{1}$$

Here, $c = 0.3 \times 2\pi$; $p = 5$; and $\tau_i = 3s(M/2\, eV_s)$. "M" denotes a mass number of ions; "s" denotes a sheath passing time; and $V_s$ denotes a sheath voltage.

Accordingly, a net sheath voltage that contributes to the acceleration of the ions within the ion sheath, i.e., an ion response voltage $V_i(t)$ is expressed as the following equation (2).

$$V_i(t) = \alpha(f)V_s(t) \tag{2}$$

Figure 3:
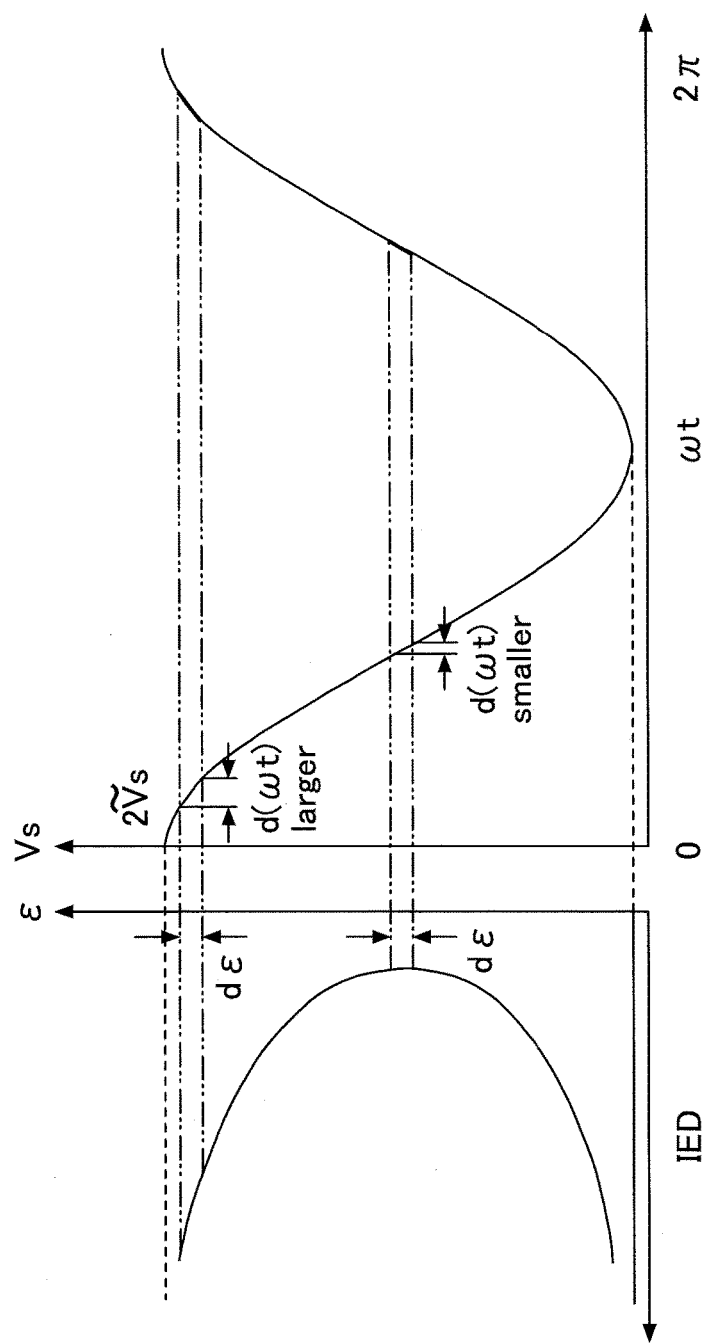
FIG. 3 is a graph showing an ion energy distribution and an ion response voltage in a single frequency RF bias method.

Based on the ion response voltage $V_i(t)$ expressed as above, an ion energy distribution (IED) can be calculated from the following equation (3) as shown in FIG. 3.

$$IED(E_i) \propto \Sigma_i(dV_i/dt_i) \tag{3}$$

FIG. 3 shows an IED and an ion response voltage $V_i(t)$ when using a single frequency power having a relatively low frequency as a bias voltage. The width (energy band) of the IED in FIG. 3 is found to be widened as the frequency (f) decreases while narrowed as the frequency (f) increases, as can also be understood from the equations (1) to (3).

<Etching Yield>

An etching yield indicates how much a single ion contributes to etching when the single ion is incident on the wafer. As the etching yield increases, a contribution degree of the single ion to etching is increased, whereas as the etching yield decreases, a contribution degree of the single ion to etching is decreased. If the etching yield becomes zero (0), the ion does not contribute to etching at all.

Figure 4:
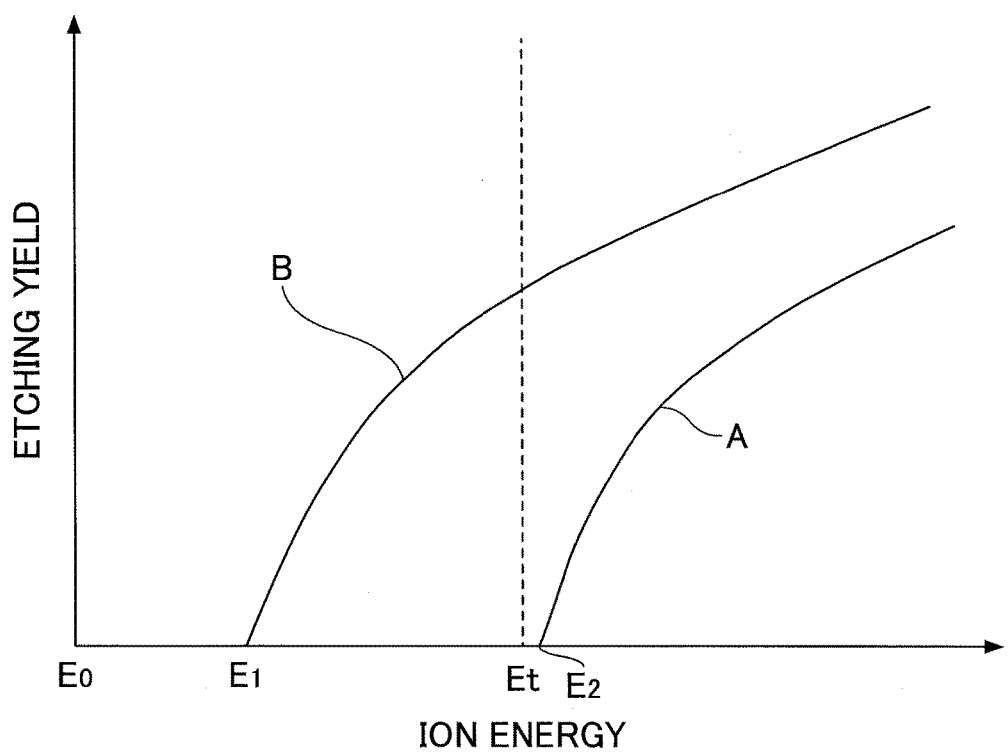
FIG. 4 is a graph showing ion energy dependency of etching yields of a first polymer A and a second polymer B.

FIG. 4 shows etching yield characteristics of two kinds of a first polymer A (organic film) and a second polymer B (organic film) with respect to ion energy when the ion is incident on the first polymer A and the second polymer B.

By way of example, a relationship between energy of an incident single oxygen ion and etching yield of the first polymer A and the second polymer B can be schematically depicted in FIG. 4. As can be seen from FIG. 4, as the ion energy decreases, the etching yields also decrease. When the ion energy decreases to less than or equal to a certain level, the etching yield decreases sharply. Etching yield characteristic curves are different depending on the kinds of the organic films. Accordingly, even if the two first polymer A and the second polymer B are etched under the same etching conditions, etching rates thereof become different. Here, for the first polymer A, the etching yield drastically becomes zero at an ion energy value $E_2$, and for the second polymer B, the etching yield drastically becomes zero at an ion energy value $E_1$ ($E_2>E_1$). An ion energy value at which a difference between the etching rates is greatest is an ion energy value $E_t$ (threshold value) right below the ion energy value $E_2$ at which the etching yield of the first polymer A rapidly decreases to zero (0). Thus, in order to increase a selectivity, it is possible to optimize etching conditions so as to obtain an ion energy distribution characteristic where the ions are concentrated in an ion energy range near the threshold value $E_t$. Further, it is possible to optimize etching conditions so as to obtain an ion energy distribution characteristic where the ions are distributed in an ion energy range where an ion energy value ranges from $E_1$ to $E_t$. Further, in the range of ion energy values $E_0$ to $E_1$, neither the first polymer A nor the second polymer B is etched. Further, in the range larger than or equal to $E_2$, although both the first polymer A and the second polymer B are etched, the selectivity thereof is not sufficient.

For the first polymer A, polystyrene PS may be used, for example, and for the second polymer B, methyl methacrylate PMMA may be used, for example. In the following, there will be explained a detailed etching process for forming a pattern by using these materials.

<Self-Assembled Block Copolymer>

In a DSA (Directed Self-assembled) process, a self-assembled periodic pattern is formed by self-assembling a first and a second polymer of a block copolymer on an underlying film. Through this process, a finer pattern can be formed as compared to the current photolithography. Thus, if it is possible to selectively appropriately remove one of the polymers of the self-assembled periodic pattern, by using the etched pattern, it becomes possible to achieve micro-processing with a critical dimension below a critical dimension of microprocessing using the current photolithography.

Figure 5:
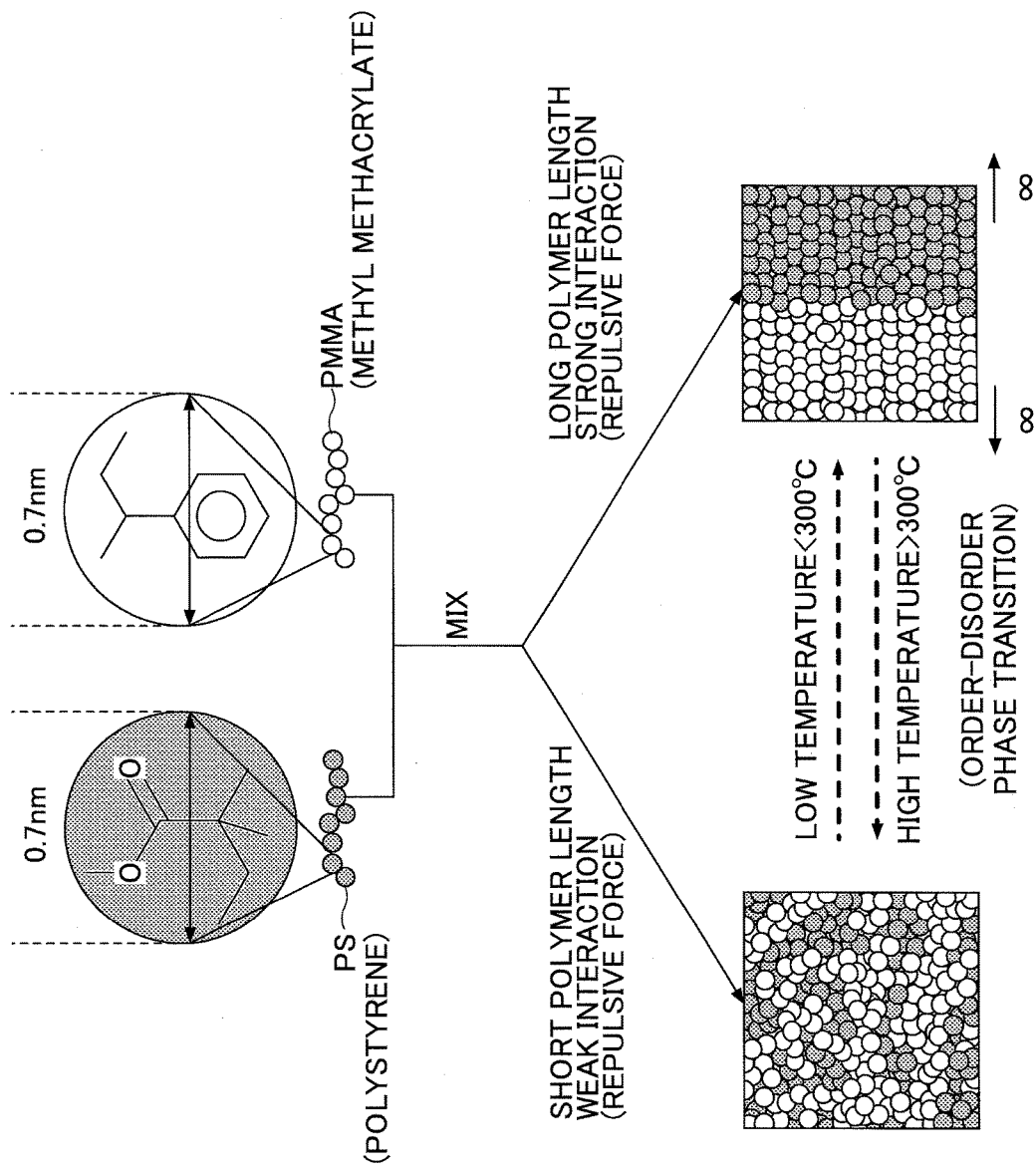
FIG. 5 is a diagram for explaining self-assembly of polystyrene PS and methyl methacrylate PMMA.

First, self-assembly of the block copolymer will be discussed with reference to FIG. 5. Each of the polystyrene PS and the methyl methacrylate PMMA is polymer having a molecular diameter of 0.7 nm.

A block copolymer layer containing polystyrene PS and PMMS, which are not mixed with each other, is formed on an underlying film. In this state, heat-treatment (annealing) is performed at a temperature (low temperature) from a room temperature (25° C.) to less than or equal to 300° C. In general, when the heat-treatment is performed from 200° C. to 250° C., the block copolymer layer is phase-separated. If, however, the heat-treatment is performed at a temperature higher than 300° C., the block copolymer layer may not be phase-separated, but the polystyrene PS and the PMMS may be arranged randomly. Further, even if the temperature is returned back to the room temperature after the phase-separation, the phase-separated state of the block copolymer layer is maintained.

Figure 6A:
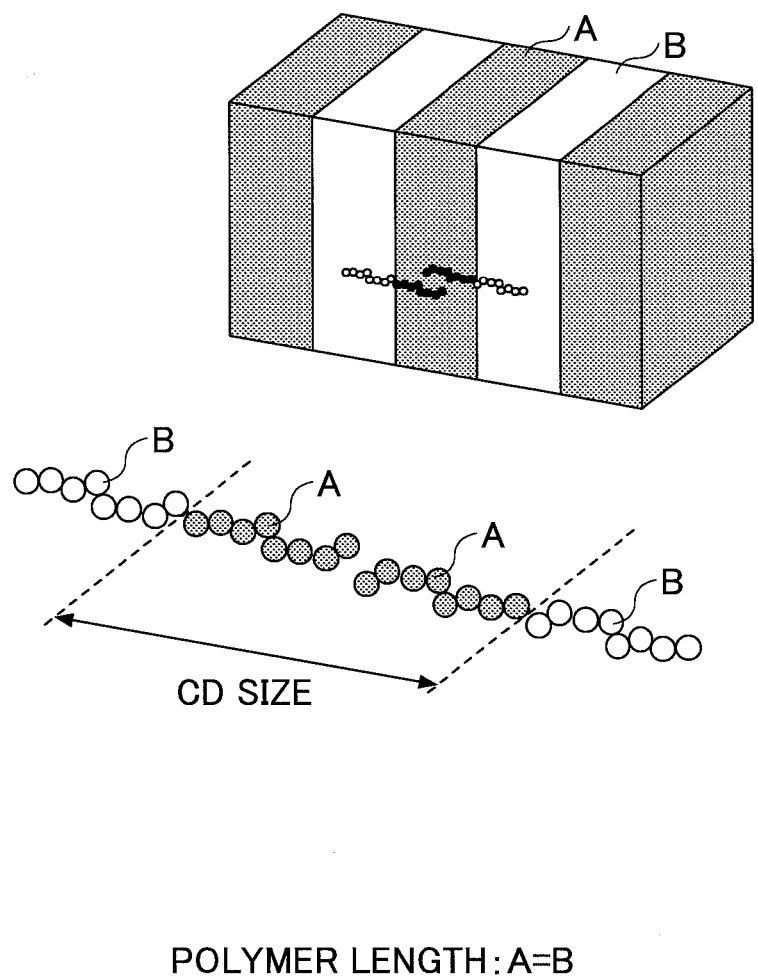

When a polymer length of each polymer is short, interaction (repulsive force) is weakened and a hydrophilic property is strengthened. On the other hand, when a polymer length of each polymer is long, interaction (repulsive force) is strengthened and a hydrophobic property is also strengthened. By using such a polymer property, a phase-separation structure of the polystyrene PS and the methyl methacrylate PMMA can be applied to a semiconductor pattern, as shown in FIGS. 6A and 6B, for example. FIG. 6A illustrates a phase-separation structure when the first polymer A (polystyrene PS) and the second polymer B (methyl methacrylate PMMA) have substantially the same polymer lengths (A=B). In this structure, the interactions between the respective polymers are the same. Accordingly, when the block copolymer layer is heat-treated at a temperature of, e.g., about 250° C., the first polymer A and the second polymer B are self-assembled and phase-separated in a line shape. This phase-separation structure may be applicable to a semiconductor manufacturing pattern as a periodic pattern of a line-and-space (L/S).

FIG. 6B illustrates a phase-separation structure when the polymer lengths of the first polymer A and the second polymer B are greatly different (A>B). In this structure, interaction (repulsive force) of the first polymer A is strong, whereas interaction (repulsive force) of the second polymer B is weak. Due to this strength difference in the interactions between the polymers, when the block copolymer layer is heat-treated at a temperature of, e.g., about 250° C., the first polymer A is self-assembled outward while the second polymer B is self-assembled inward. As a result, the polymers A and B are phase-separated in a hole shape. This phase-separation structure may be applicable to a semiconductor manufacturing pattern as a periodic pattern of a hole.

As stated above, if the self-assembled periodic pattern of the block copolymer is arranged in a line shape in a certain direction, a line-and-space pattern is formed. Meanwhile, if one polymer pattern is arranged to surround the other polymer pattern, a hole pattern is formed. As for the phase-separation structure of the block copolymer, there are many other various structures besides the line shape or the hole shape. Desirably, however, the above-mentioned line shape or hole shape may be used as a semiconductor pattern.

In this embodiment, as explained above with reference to FIG. 4, the second polymer B which is capable of being etched by a lower energy by which the other of the polymers (the first polymer A) is not etched is set to be a material to be etched, and the first polymer A is left as a mask, which is hardly etched at an energy at which an etching yield of the second polymer B is relatively high. With this, the second polymer B can be selectively appropriately etched from a self-assembled periodic pattern which is formed to have a fine pattern.

Thus, when forming holes shown in FIG. 6B, the length of the first polymer A is set longer than that of the second polymer B so that the second polymer B corresponds to the hole portions.

<Mask Formation Using Self-Assembled Block Copolymer>

Next, a process of forming a mask by using the above-described self-assembled block copolymer will be explained with reference to FIGS. 7(a) to 7(g).

First, an organic film 105 shown in FIG. 7(b) is formed on a base layer 100 with an initial state shown in FIG. 7(a). The base layer 100 is formed of silicon (Si), a silicon oxide film (SiO), organic films (an amorphous carbon film and an organic SOG film), and so forth. The base layer 100 is a film to be etched by the mask of the self-assembled block copolymer of the embodiment.

After the organic film 105 is coated, heat-treatment is performed as illustrated in FIG. 7(c). Though an appropriate heating temperature depends on the kind of an organic film, the heating temperature may range, e.g., from about 200° C. to about 300° C., typically. In the present embodiment, the heat-treatment is performed at, e.g., 250° C. After the heat-treatment, an entire size of the organic film 105 (105a and 105b) is reduced, and a surface thereof becomes a modified layer 105b in which a carbon component is modified.

In this state, the modified layer 105b is removed chemically by developing the modified layer 105b, as shown in FIG. 7(d). As a result, there is obtained a neutral film 105a whose surface is neutral, neither hydrophobic nor hydrophilic. As stated above, if the polymer length of each of the polymers of the block copolymer is short, a hydrophilic property is strengthened, whereas if the polymer length is long, a hydrophobic property is strengthened. As such, there are a polymer type having a strong hydrophilic property and a polymer type having a strong hydrophobic property. Thus, the modified layer 105b whose surface is neutral is provided on the base layer 100 as a guide so that the polymer can be phase-separated in a desired shape.

Then, as illustrated in FIG. 7(e), a polymer layer 120 is coated on the neutral film 105a. Here, the polymer layer 120 contains polystyrene PS as a first polymer and methyl methacrylate PMMA as a second polymer. Since these polymers can be phase-separated without the guide (modified layer 105b), the guide may not be necessarily provided. By using the guide, or a hydrophilic property or a hydrophobic property of the base layer 100, a phase-separation state of the coated polymer may be controlled. After the polymer layer 120 is coated, when the polymer layer 120 is heat-treated at a temperature of, e.g., 250° C., the polymer layer 120 is phase-separated to polystyrene PS and methyl methacrylate PMMA as shown in FIG. 7(f). The diameter of each of the phases shown by "$d_1$" and "$d_2$" (hereinafter, referred to as CD values as well) is a size set by self-assembly.

Finally, as illustrated in FIG. 7(g), by selectively etching the polystyrene PS (first polymer A) and the methyl methacrylate PMMA (second polymer B) that are self-assembled and phase-separated, the methyl methacrylate PMMA is removed and a polystyrene PS (first polymer A) pattern is obtained.

<Pattern Period and Error of Self-Assembled Block Copolymer>

Figure 8:
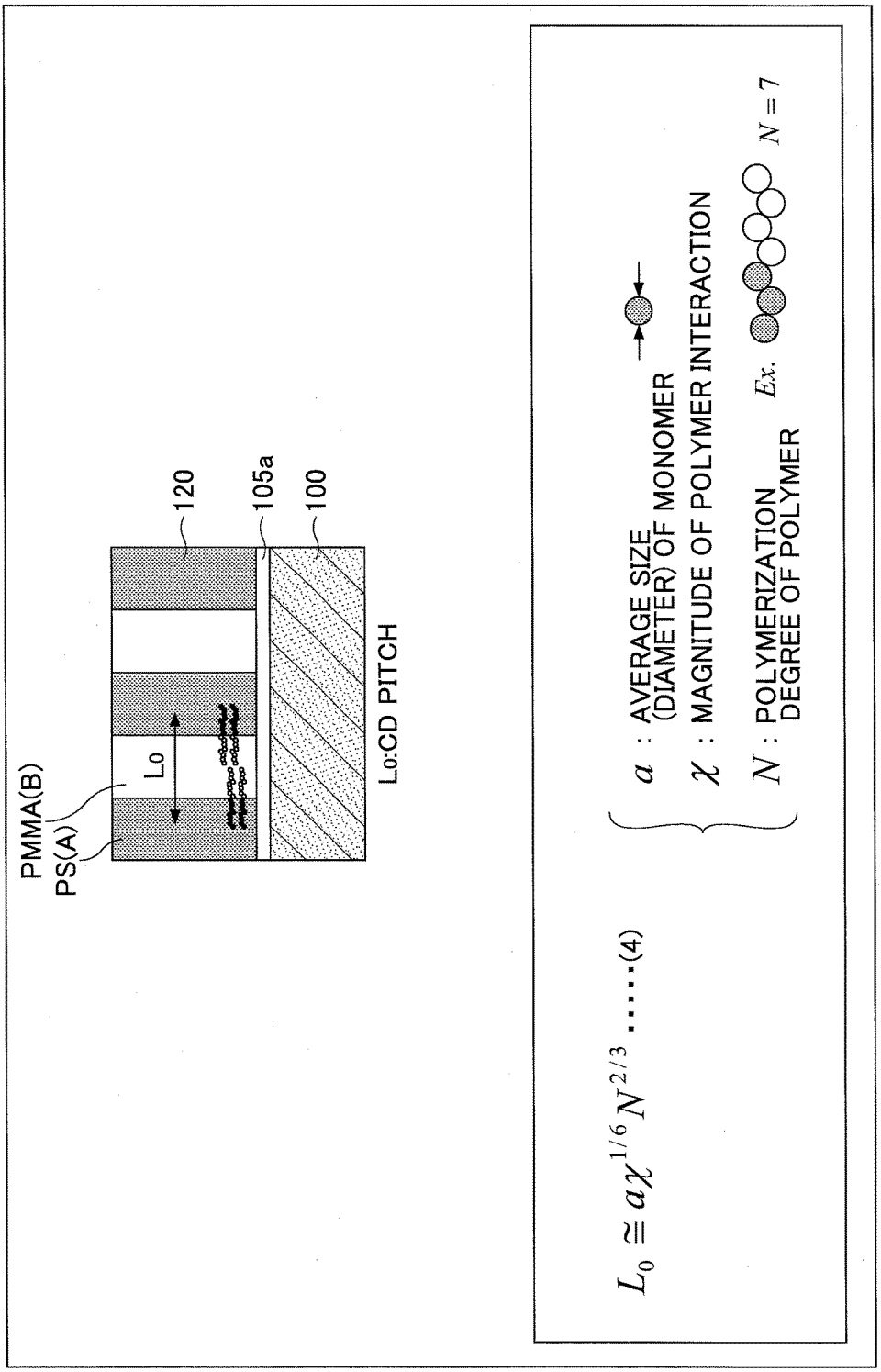
FIG. 8 is a diagram for explaining a period of the phase-separation structure.

A pattern period ($L_O$) of the self-assembly of the block copolymer is expressed by the equation (4) of FIG. 8.

$$L_O = a\chi^{1/6} N^{2/3} \quad (4)$$

Here, "a" denotes an average size (diameter) of a monomer; "$\chi$" denotes a magnitude of polymer interaction; and "N" denotes a polymerization degree of a polymer.

According to this equation, the pattern period $L_O$ of self-assembly is a value relevant to a molecular size of the block copolymer. It is possible to form a pattern having a dimension smaller than a critical dimension obtained by microprocessing using the conventional photolithography.

Figure 9:
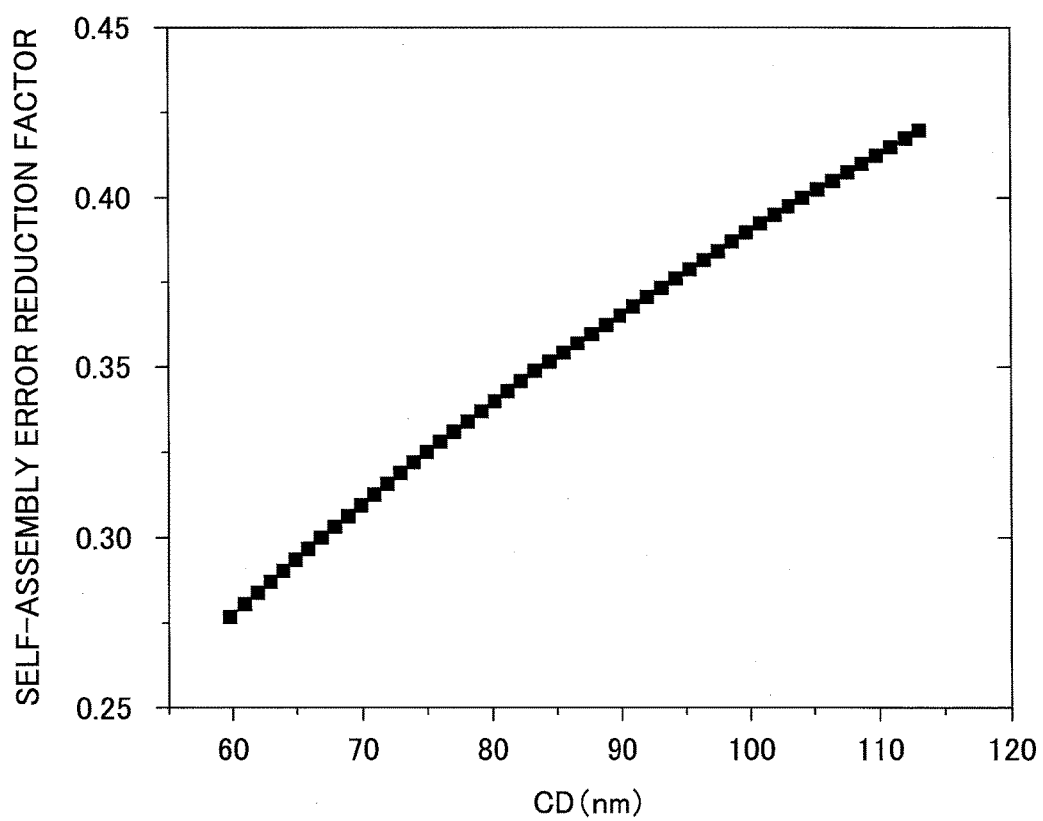
FIG. 9 is a graph showing a relationship between a prepattern and a self-assembly error reduction factor.

Further, an error included in a pattern formed by the self-assembly process will be explained with reference to FIG. 9. FIG. 9 shows a self-assembly error reduction factor with respect to a CD value of an opening pattern formed by self-assembly. As can be seen from this graph, as a CD value of a formed pattern decreases, an error of a self-assembly error reduction factor is decreased. Accordingly, as the CD value of the formed pattern decreases, non-uniformity in the CD value, i.e., an error included in the CD value is also decreased. That is, in the self-assembly process, the error included in the CD value may be decreased as a processing dimension is reduced. Typically, in the photolithography, an error included in a pattern is increased as a processing dimension is reduced. In contrast, in the self-assembly process, as the processing dimension is reduced, more precise patterning may be obtained.

As stated above, from the pattern period $L_O$ of the self-assembly of the block copolymer, a dimension of a structural unit formed by the block copolymer is within, for example, about 10 nanometers order which typically has been difficult to achieve in the conventional photolithography. Further, the block copolymer is applied to the conventional semiconductor, optical and magnetic processes. Accordingly, the structural unit formed of the block copolymer may be easily applied to semiconductor, optical and magnetic devices. Moreover, an error included in the self-assembled pattern of the block copolymer is reduced as the processing dimension decreases.

When performing an etching process by using, as an etching mask, a structure having a dimension difficult to achieve in the photolithography, an error due to the etching process of the self-assembled pattern may become greater than a self-assembly error in a representative dimension of a self-assembled material, e.g., in a CD value of an opening. Thus, non-uniformity in the dimension of a finally obtained pattern may not be allowed.

Thus, by controlling the etching condition in the step shown in FIG. 7(g) in this embodiment the second polymer B is made to be selectively appropriately etched. In an etching method to be described later in accordance with the present embodiment, by optimizing etching conditions for a periodic pattern formed by the self-assembly of the block copolymer, non-uniformity in the dimension of a finally obtained pattern may be minimized. That is, a frequency of a high frequency power supply or the like is set such that a great amount of ion energy are distributed in a range smaller than ion energy distribution at which an etching yield of the first polymer A is generated and larger than or equal to ion energy distribution at which an etching yield of the second polymer B is generated, and a high frequency power of the set frequency is supplied into the processing chamber (chamber 10) from the high frequency power supply. Here, the "ion energy distribution at which the etching yield of the first polymer A is generated" may be an energy having a peak at an energy value at which etching yield of the first polymer A is generated. Similarly, the "ion energy distribution at which the etching yield of the second polymer B" may be an energy having a peak at an energy value at which the etching yield of the second polymer B is generated. It means that in this embodiment, a frequency of a high frequency power supply or the like is set i.e., in a range where an ion energy value falls within a range from the values $E_1$ to $E_2$ of FIG. 4 and a high frequency power of the set frequency is supplied into the processing chamber (chamber 10) from the high frequency power supply. Especially, etching conditions for obtaining an ion energy distribution characteristic as illustrated in FIG. 4 is investigated and optimized. In FIG. 4, ions are concentrated in an ion energy range near a threshold value $E_t$ at which an etching yield of the first polymer A (polystyrene PS) is smaller than zero (0) and an etching yield of the second polymer B (methyl methacrylate PMMA) has a large value.

<CD Loss, Verticality and Selectivity>

Figure 10:
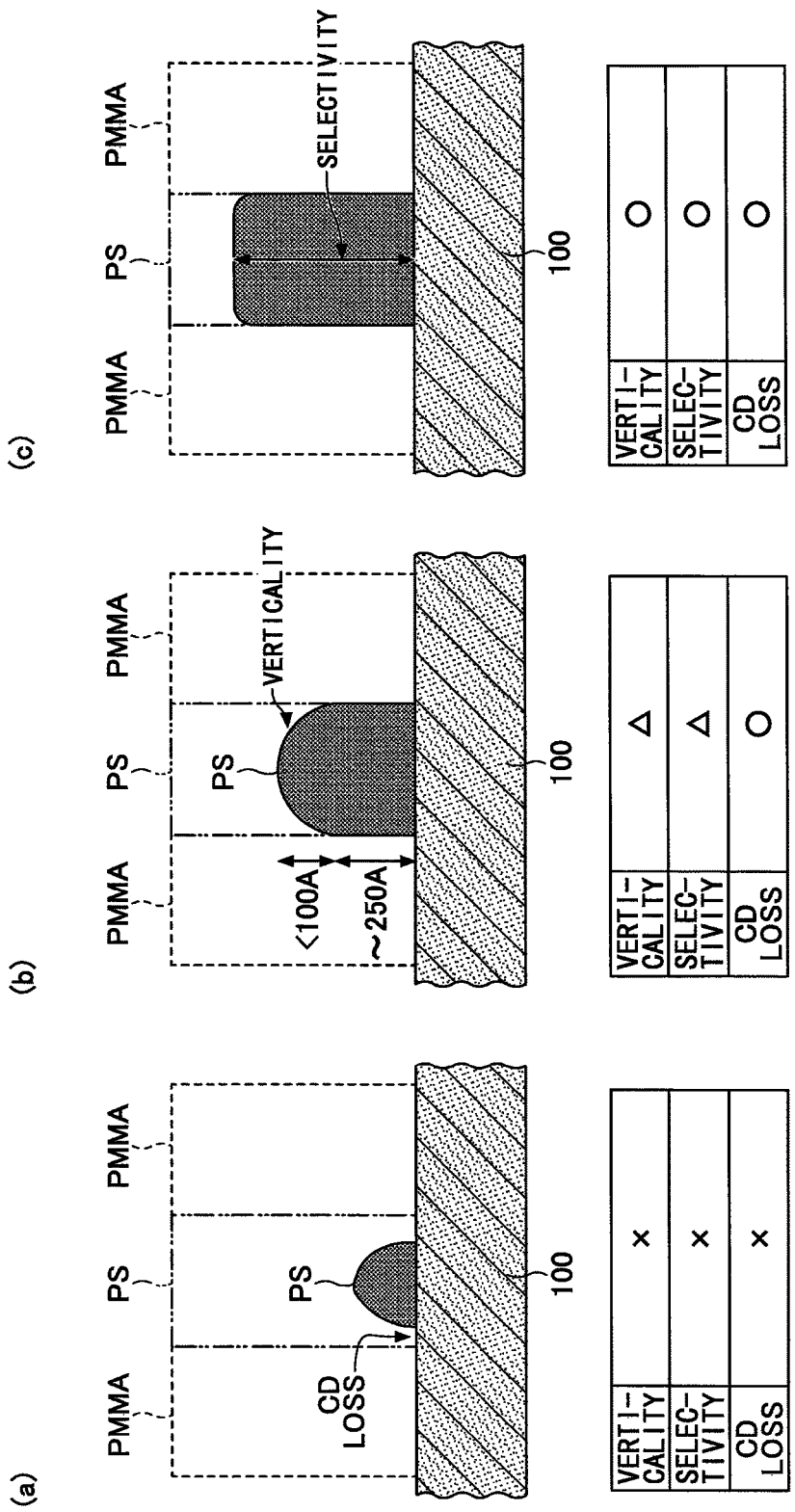
FIG. 10 is a view for explaining a CD loss, verticality and selectivity.

As evaluating items for the self-assembled periodic pattern of the block copolymer, a verticality, a selectivity and a CD loss are used. As depicted in FIG. 10, a CD loss indicates a state where a sidewall of the polystyrene PS as well as the methyl methacrylate PMMA is removed by etching and a pattern (a width of the polystyrene PS) is narrowed and, thus, a required CD value is not obtained. In FIG. 10(a), a CD loss is found to occur, whereas in FIGS. 10(b) and 10(c), a CD loss does not occur.

Verticality indicates a rounded degree of a top portion of the polystyrene PS by the etching. A low verticality is not desirable because not only the ions reaching the polystyrene PS from a vertical direction but the ions reaching the polystyrene PS from inclined directions are also allowed. In FIG. 10(a), since a head portion of a pattern is completely rounded, verticality is low. In FIG. 10(b), since a head portion of a pattern is slightly rounded, verticality is slightly low. In FIG. 10(c), since a head portion of a pattern is not rounded, verticality is high.

A selectivity is an etching ratio of the methyl methacrylate PMMA to the polystyrene PS. The selectivity may be expressed by a height of the polystyrene PS pattern. In FIG. 10(a), since a height of the polystyrene PS is low and the methyl methacrylate PMMA is not selectively etched against the polystyrene PS, the selectivity is low. In FIG. 10(b), since the height of the polystyrene PS is not sufficiently high, the selectivity is slightly low. In FIG. 10(c), since the height of the polystyrene PS is high, the selectivity is sufficiently high.

<Etching Result of Self-Assembled Periodic Pattern>

Figure 11:
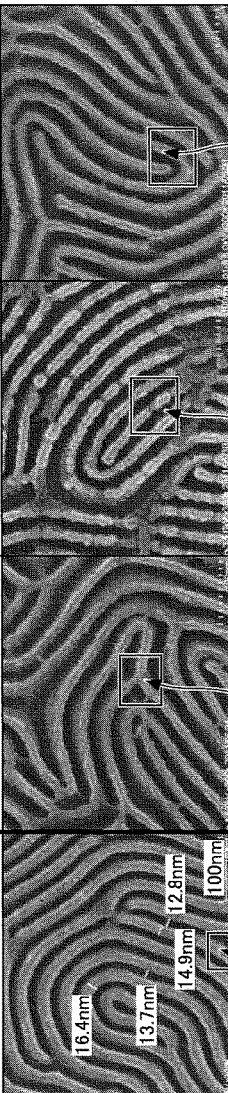
FIG. 11 is a diagram showing a result of investigating PS shapes depending on frequencies applied to respective apparatuses of the embodiment.

According to the above-mentioned evaluating items, etching results of periodic patterns of self-assembled polystyrene PS and methyl methacrylate PMMA by using respective apparatuses S, T, U and R are shown in FIG. 11. Each of the apparatuses S, T and U has the same structure as the plasma processing apparatus 1 shown in FIG. 1 and is a capacitively coupled plasma processing apparatus (CCP) whereas the apparatus R is an inductively coupled plasma processing apparatus (ICP).

In the apparatus S, a high frequency power having a frequency of, e.g., 100 MHz is applied to a lower electrode (susceptor 16) without applying a high frequency power to an upper electrode 48. In the apparatus T, a high frequency power of, e.g., about 60 MHz is applied to an upper electrode 48 without applying a high frequency power to a lower electrode (16). In the apparatus U, a high frequency power of, e.g., 40 MHz is applied to a lower electrode (16) without applying a high frequency power to an upper electrode 48. In the apparatus R, a high frequency power of, e.g., 27.12 MHz is applied to an upper electrode 48 without applying a high frequency power to a lower electrode.

Other etching conditions in the CCP processing apparatuses S, T and U are as follows.

Kind of gas and gas flow rate: $Ar/O_2=850/50$ sccm
High frequency power: 100 W
Pressure: 75 mT (about 9.99915 Pa)

In the apparatus S, plasma is generated for 15 seconds while the high frequency power of 100 MHz is applied to the lower electrode (16). In the apparatus T, plasma is generated for 90 seconds while the high frequency power of 60 MHz is applied to the upper electrode 48. In the apparatus U, plasma is generated for about 30 seconds while the high frequency power of 40 MHz is applied to the lower electrode (16).

Other etching conditions in the ICP processing apparatus R are as follows.

Kind of gas and gas flow rate: $O_2=1600$ sccm
High frequency power: 100 W
Pressure: 200 mT (26.6644 Pa)

In the apparatus R, plasma is generated for 90 seconds while the high frequency power of 27.12 MHz is applied to the upper electrode.

Under the above-specified etching conditions, the periodic pattern of the self-assembled polystyrene PS and methyl methacrylate PMMA is etched for the above-mentioned plasma generation time. The result is shown as the PS shape (plane views) FIG. 11. In FIG. 11, enlarged cross sectional views of the plane images are also provided. Methyl methacrylate PMMA is selectively etched and a pattern of polystyrene PS is formed by etching.

As can be seen from FIG. 11, in the apparatus S, a required pattern having a sufficient CD value is formed. In the apparatuses T and R, on the other hand, CD values are not sufficient (CD losses have occurred), and patterns are narrowed. Further, in the apparatus U, pitting, in which patterns are cut here and there, is found to occur. Especially, at a portion where the pitting has occurred, an etching amount locally increases and a pattern height decreases. Thus, a sufficiently high selectivity is not obtained.

As can be seen from this result, in the apparatus T in which the plasma is generated by applying the high frequency to the upper electrode 48, dependency of ion attraction upon the frequency of the high frequency power is not observed. In the etching in the apparatus T, since the etching is performed primarily by radicals, ions are incident isotropically. Accordingly, it is assumed that since there is no directivity, CD losses have occurred. This is the same for the apparatus R.

Meanwhile, in the etching of the apparatuses S and U, from the evaluation of the verticality, the selectivity, and the CD loss, a selectivity obtained for the apparatus S in which the high frequency power of, e.g., 100 MHz is applied to the lower electrode (16) is better than that obtained for the apparatus U in which the high frequency power of, e.g., 40 MHz is applied to the lower electrode (16). With this result, for the apparatuses S and U in which the plasma is generated by applying the lower electrode (16), ion attraction is generated to reduce the CD loss, however, if the frequency of the high frequency power is set to be, e.g., 40 MHz, ion attraction is less performed as compared to the case of setting the frequency of the high frequency power to be, e.g., 100 MHz. This result indicates that when a high frequency power for plasma generation is applied to the lower electrode (16), the high frequency power may not only contribute to the plasma generation but also contribute to ion attraction. Further, the result also indicates that ion attraction depends on the frequency of the high frequency power.

<Frequency Dependency of Ion Energy>

Frequency dependency of ion energy will be discussed in detail based on an experimental result. In the following, both the ICP etching apparatus and the CCP etching apparatus are respectively examined.

(ICP Etching Apparatus: Frequency Dependency of Ion Energy)

Figure 12:
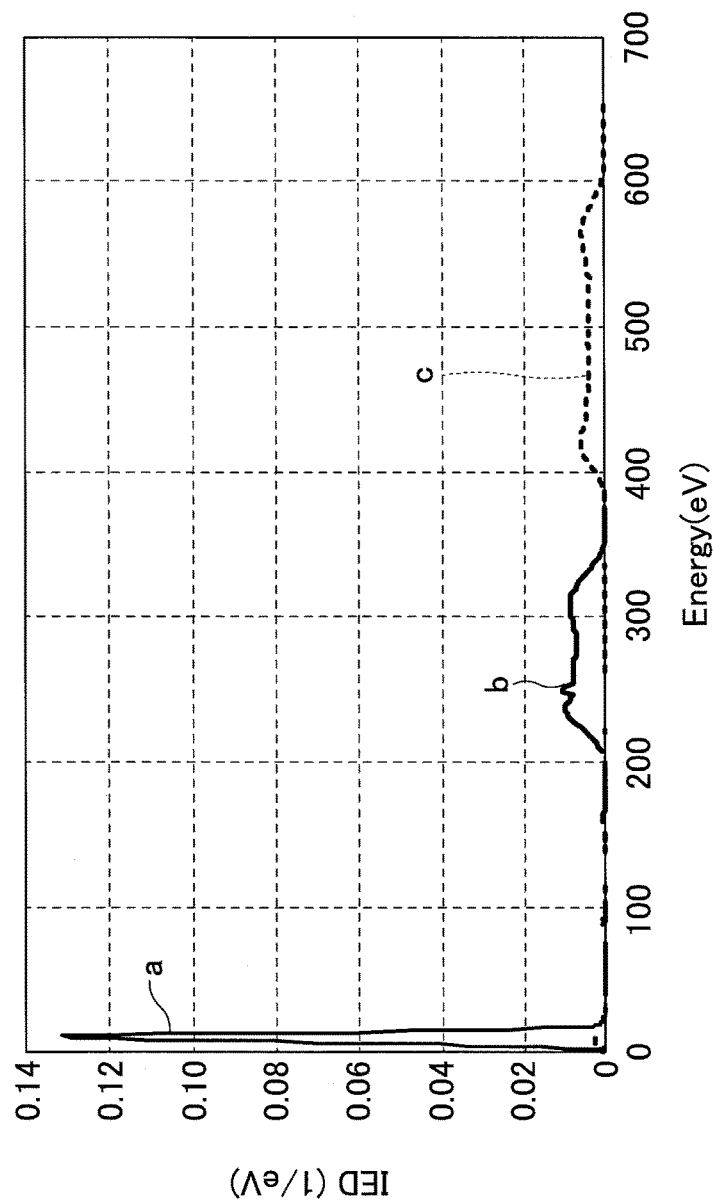
FIG. 12 is a diagram showing a frequency dependency of an ion energy distribution in an ICP etching apparatus of the embodiment.

FIG. 12 is a graph showing dependency of an ion energy distribution upon a frequency of a high frequency power in an ICP processing apparatus of the present embodiment. A horizontal axis represents ion energy, and a vertical axis represents an ion energy distribution (IED).

Etching conditions are as follows.

Kind of gas and gas flow rates: $Ar/O_2=300/30$ sccm High frequency power applied to upper electrode 48: 200 W
High frequency power applied to lower electrode (16): 0 W, 200 W, or 500 W
Pressure: about 10 mT (1.33322 Pa)

In the ICP etching apparatus, ion energy distributions are remarkably different between the two cases when applying a high frequency bias power to the lower electrode and when applying no high frequency bias power to the lower electrode in addition to applying a high frequency power of a frequency of, e.g., 27.12 MHz for plasma generation to the upper electrode. When applying a high frequency bias power to the lower electrode, a high frequency power of a frequency ranging, e.g., from 800 kHz to 13 MHz is applied to the susceptor 16 so that ions are attracted while maintaining ion energy high.

FIG. 12 shows a case (a) of applying only a high frequency power for plasma generation of 27.12 MHZ to the upper electrode without applying a high frequency bias power to the lower electrode and cases of applying a high frequency power of, e.g., 13 MHZ to the lower electrode in addition to applying the high frequency power for plasma generation to the upper electrode while setting a level of the high frequency power to be high and low (low=200 W (b), high=500 W (c)). When attempting to reduce ion energy by lowering the level of the high frequency bias power at this frequency band, the following problems may occur.

(1) In view of (b) and (c) of FIG. 12, if the level of the high frequency bias power is reduced, ion energy is not monochromatic and there is generated an ion energy distribution having a wide width around a central ion energy or having two peaks. Accordingly, ion attraction efficiency becomes poor and an etching rate is not high even when generating plasma of the same density in comparison with a case where a level of the high frequency bias power is high. Furthermore, if the ion energy is distributed with the wide width around the central ion energy, since ions having a high energy and ions having a low energy are mixed with each other, a desired etching shape cannot be achieved unless the etching is performed at a low etching rate for a long time. In such a case, however, radicals having longer lifetime than ions may affect the etching, so that the polystyrene PS is etched and the selectivity is deteriorated. Further, if an energy difference in threshold values between polymers, i.e., an energy difference $E_2-E_1$ of FIG. 4 is close, a margin would be very narrow and controllability would be low even if a high selectivity is obtained.

(2) Since it is difficult to maintain plasma only with the high frequency bias power, a high frequency power for plasma generation needs to be applied to the upper electrode. At this time, as a portion at which plasma density is high is positioned near the opposing electrode, the radicals are relatively increased on the wafer W due to a difference in the lifetime of ions and radicals until the plasma is diffused to the wafer W. Accordingly, the radicals affect the etching, so that the polystyrene PS is etched and the selectivity is lowered.

(3) In the case (a) of FIG. 12, since the ion energy is too low, an etching rate also becomes low.

(CCP Etching Apparatus: Frequency Dependency of Ion Energy)

Figure 13:
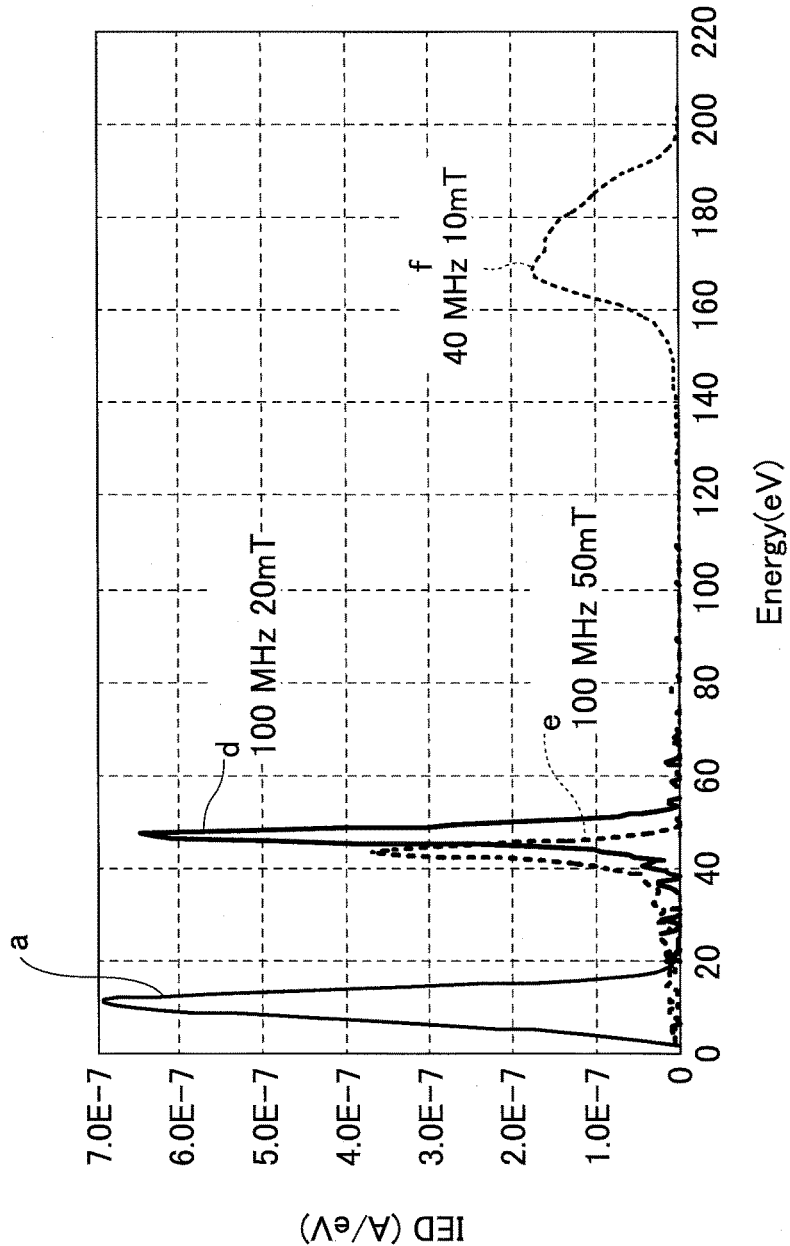
FIG. 13 is a diagram showing a frequency dependency of an ion energy distribution in a CCP etching apparatus of the embodiment.

Next, a frequency dependency of ion energy in a CCP etching apparatus will be described with reference to FIG. 13. FIG. 13 shows a case of applying a high frequency power of, e.g., 40 MHz or 100 MHz to a lower electrode (16) in a CCP processing apparatus. As a comparative example, an ion energy distribution in case of applying a high frequency power to the upper electrode without applying a RF bias in the ICP etching apparatus as shown in FIG. 12 as (a) is also shown. Here, the high frequency applied to the lower electrode (16) is a single high frequency (single frequency).

Etching conditions in the CCP processing apparatus are as follows.

Kind of gas and gas flow rate: $Ar/O_2=300/30$ sccm
High frequency power applied to upper electrode: zero
High frequency power applied to lower electrode: 200 W
Pressure: 20 mT (2.66644 Pa) or 50 mT (6.6661 Pa) for 100 MHz, or 10 mT (1.33322 Pa) for 40 MHz As compared to the case (b) of applying the high frequency power to the upper electrode and also applying the high frequency bias power of relatively lower frequency of, e.g., 13 MHz while setting a level of the high frequency bias power to be low to the lower electrode in the ICP etching apparatus of FIG. 12, if the high frequency power of, e.g., 100 MHz is applied to the lower electrode (16) (single frequency power), ion energy becomes monochromatic and is easily fall within the energy difference $E_2-E_1$ of FIG. 4. Thus, a theoretical selectivity can be easily obtained.

This tendency is observed more remarkably in the case of 100 MHz (d, e) than in the case of 40 MHz (f). That is, this tendency gets stronger as the frequency increases. Further, since plasma generation efficiency improves, it may be possible to maintain plasma only with the high frequency bias power applied to the wafer W (only applying the high frequency power to the lower electrode (16)). For the reason, as compared to the ICP processing apparatus or the like, plasma density necessary to be generated to attract the same number of ions into the wafer is lower, and it is possible to prevent radicals in the plasma from etching a material such as polystyrene PS which is not intended to be etched. Furthermore, as compared to the ion energy distribution in the ICP processing apparatus (only to upper electrode of ICP, RF bias not applied) (a), ion energy is not extremely low so that an etching rate can be maintained high.

In FIG. 13, when applying the high frequency power of, e.g., 40 MHz to the lower electrode (16) (single frequency power to lower electrode (f)), the ion energy is distributed to have a slightly wide width around a central ion energy, as compared to the case of applying the high frequency power of, e.g., 100 MHz to the lower electrode (single frequency power to lower electrode (d, e)). Accordingly, attraction efficiency is poor for the case of (f), and, thus, even if plasma having same density is generated, an etching rate is not increased as compared to the case when the level of the high frequency bias power is high. In such a case, if etching is performed at a low etching rate for a long time, radicals may affect a plasma process because the lifetime of the radicals is longer than that of ions as described above. Accordingly, the polystyrene PS is etched, and the selectivity is deteriorated. In the result provided in FIG. 11, when applying the high frequency power of, e.g., 40 MHz to the lower electrode, the shape of the polystyrene PS pattern is found to be worse and pitting has occurred at some places, as compared to the case of applying the high frequency power of, e.g., 100 MHz to the lower electrode. Thus, a sufficient selectivity is not obtained.

Further, when applying the high frequency power of, e.g., 100 MHz, there is no great waveform difference in cases that the pressure is set to be 20 mT (2.66644 Pa) (d) and 50 mT (6.6661 Pa) (e), respectively. As can be seen from this result, an ion energy distribution depends on a frequency, but does not depend on a pressure.

<Appropriate Values of Frequency and Ion Energy>

From the above, it is found out that an ion energy distribution has a frequency dependency. Further, it is also found out that it is desirable to apply a high frequency power to the lower electrode (16) which involves in ion attraction. Here, appropriate values of a frequency of the high frequency power and ion energy will be discussed in further detail. Specifically, in order to maintain a high selectivity between polystyrene PS and methyl methacrylate PMMA and perform an etching process effectively, a high frequency power having a frequency that allows ion energy to fall within the range of ion energy values $E_1$ to $E_2$ of FIG. 4 needs to be set and applied to the lower electrode (16). If a specific value within the ion energy range $E_1$ to $E_2$ can be expected, a high frequency power of a frequency having ion energy within such a range may be set and the high frequency power may be applied to the lower electrode (16).

(Power Dependency of Ion Energy Distribution in CCP Processing Apparatus)

Figure 14:
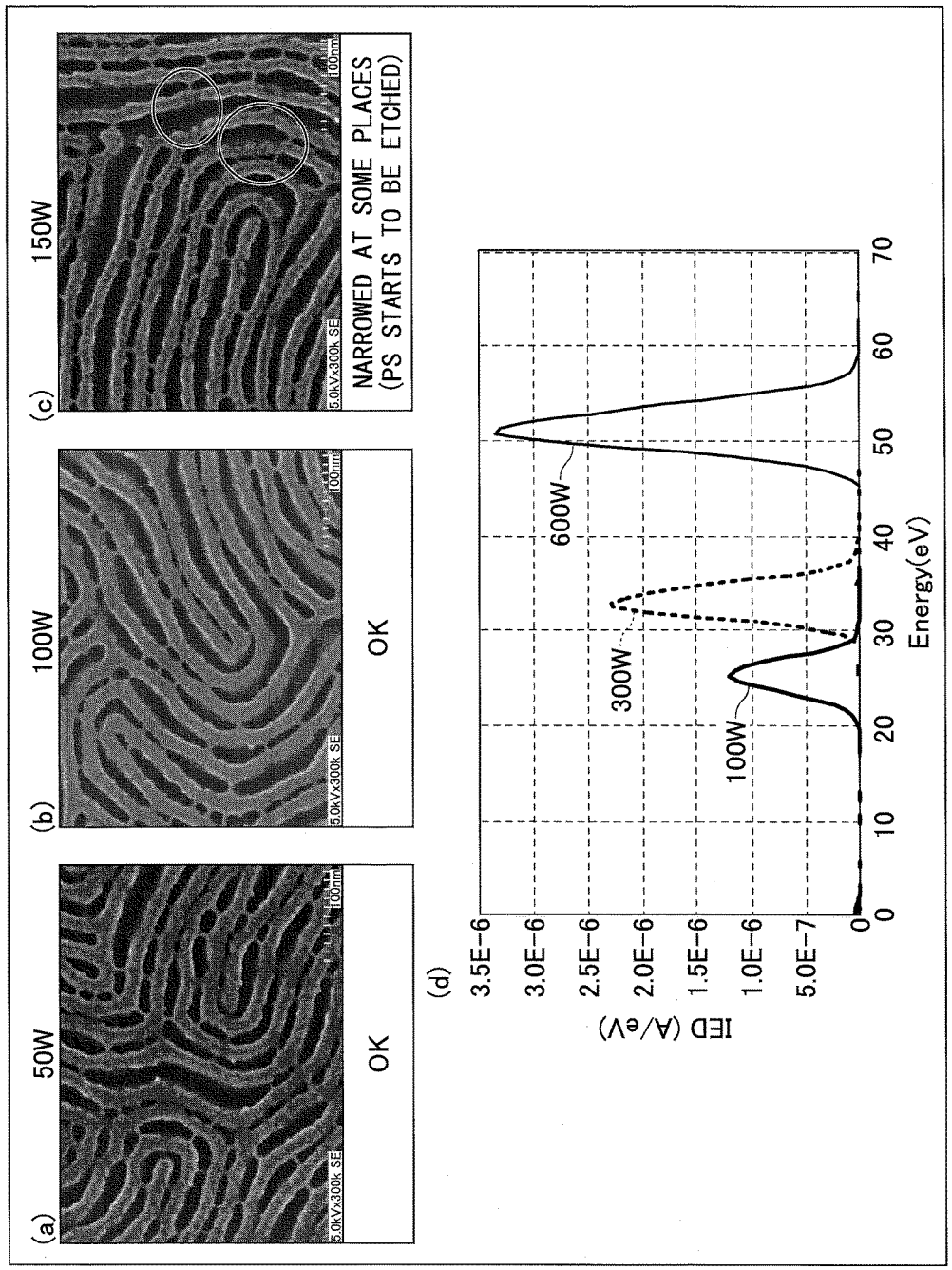
FIG. 14 is a view showing a power dependency of an ion energy distribution in a CCP etching apparatus.

To calculate appropriate values of a frequency and ion energy, a power dependency of an ion energy distribution in the CCP processing apparatus is investigated with reference to FIG. 14. FIGS. 14(a) to 14(c) are images obtained by the electron microscope of the polystyrene PS as etching results when a high frequency power of, e.g., 100 MHz to the lower electrode (16) of the CCP processing apparatus at levels of, e.g., 50 W, 100 W and 150 W, respectively. FIG. 14(d) shows a power dependency of an ion energy distribution when a high frequency power of, e.g., 100 MHz to the lower electrode of the CCP processing apparatus at levels of, e.g., 100 W, 300 W and 600 W.

Other processing conditions are as follows.
Kind of gas and gas flow rate: $Ar/O_2$=850/50 sccm
Pressure: 75 mT (9.99915 Pa)

As can be seen from FIGS. 14(a) to 14(c), when the high frequency power is 50 W in FIGS. 14(a) and 100 W in FIG. 14(b), the shapes of the polystyrene PS are found to be fine. In case of 150 W in FIG. 14(c), however, a polystyrene PS pattern is found to be narrowed at some places and polystyrene PS is found to start to be etched, which implies that a sufficient selectivity is not obtained.

Referring to the graph of FIG. 14(d), if the high frequency power increases from 100 W, 300 W and 600 W, ion energy also increases. From the above result, it can be predicted that an ion energy value becomes larger than $E_2$ of FIG. 4 and the polystyrene PS starts to be etched at ion energy higher than or equal to 30 eV. Accordingly, it can be understood that it is appropriate to apply a high frequency power having ion energy less than or equal to 30 eV in order to set the high frequency power of a frequency where the ion energy falls within the range from $E_1$ to $E_2$ of FIG. 4.

Further, although not shown in the drawings, when the high frequency power is further lowered than 50 W which is shown in FIG. 14(a) and when ion energy becomes less than 15 eV, an etching rate of the methyl methacrylate PMMA is low and due to the influence of radicals, isotropy of retreat of the polystyrene PS increases, and the polystyrene PS is etched and a CD is narrowed. Accordingly, it can be understood that it is appropriate to apply a high frequency power having ion energy more than or equal to 15 eV in order to set the high frequency power of a frequency where the ion energy falls within the range from $E_1$ to $E_2$ of FIG. 4.

(Power Dependency of Ion Energy Distribution in ICP Processing Apparatus)

Figure 15:
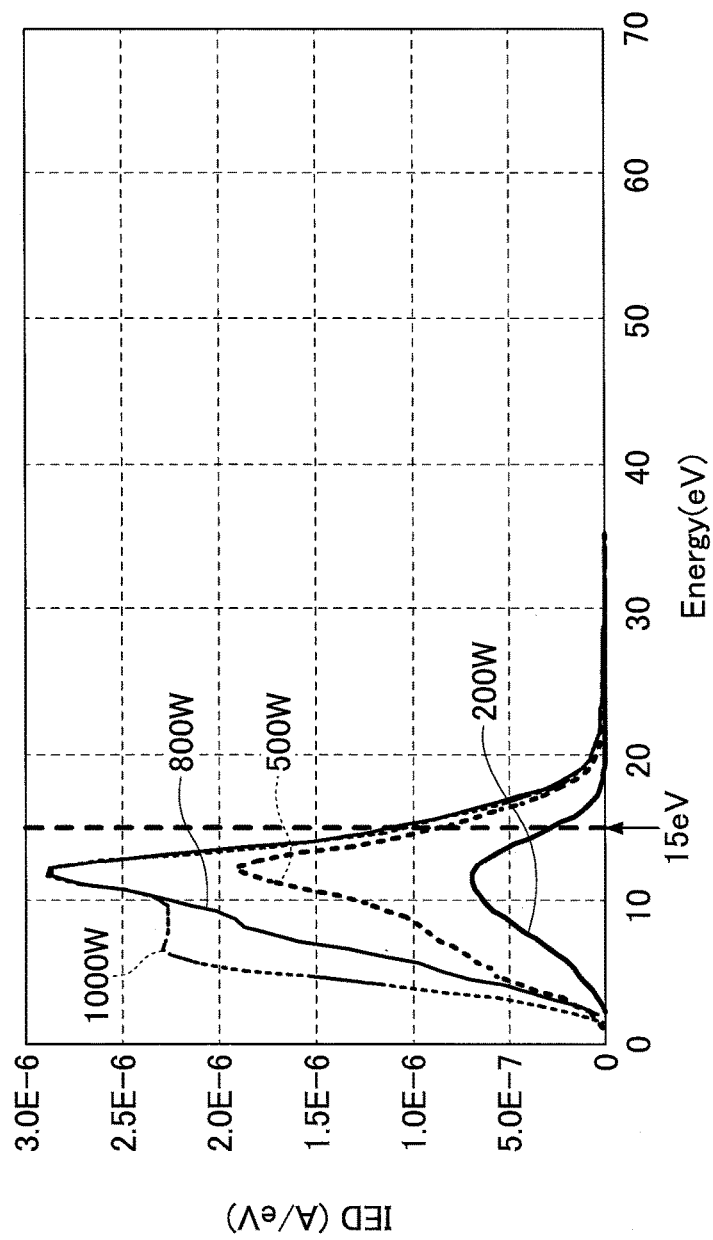
FIG. 15 is a graph showing a power dependency of an ion energy distribution in an ICP etching apparatus of the embodiment.

Next, a power dependency of an ion energy distribution in the ICP processing apparatus is investigated with reference to FIG. 15. FIG. 15 shows a power dependency of an ion energy distribution in the ICP processing apparatus. FIG. 15 shows ion energy distributions when a high frequency (27.12 MHz) power applied to the upper electrode of the ICP processing apparatus is set to be 1000 W, 800 W, 500 W and 200 W.

Other processing conditions are as follows.
Kind of gas and gas flow rate: $Ar/O_2$=300/30 sccm
Pressure: 10 mT (1.33322 Pa)

As such, when using the ICP processing apparatus, the ion energy value becomes less than 15 eV even when the high frequency power applied to the upper electrode is varied. Thus, there is a high possibility that the CD becomes narrow.

<Evaluation of Experimental Result: Width of Ion Energy>

The above-described experimental results indicate that it may be desirable to apply a high frequency power having an ion energy distribution (IED) where ion energy falls within a range from about 15 eV to about 30 eV and the ions are sharply attracted. That is, it may be desirable to apply a high frequency power having an ion energy distribution (IED) where ion energy is concentrated within a width of 15 eV, ranging from 15 eV to 30 eV. By applying a high frequency power having ion energy ranging from 15 eV to 30 eV, the methyl methacrylate PMMA can be etched with a high selectivity by attracting ions in plasma and a fine pattern of the polystyrene PS can be formed.

An optimum value of the width of the ion energy, however, may vary depending on a combination of polymers shown in FIG. 4 because there is generated a little difference in a gap of etching yield characteristic curves or etching yield characteristic curves of organic films themselves depending on combinations of kinds of the polymers. Accordingly, by varying an optimum value of the width of ion energy depending on the combination of the polymers, a precise control in an etching process can be performed.

(Ion Energy Distribution (IED) and Kind of Ion)

Figure 16A:
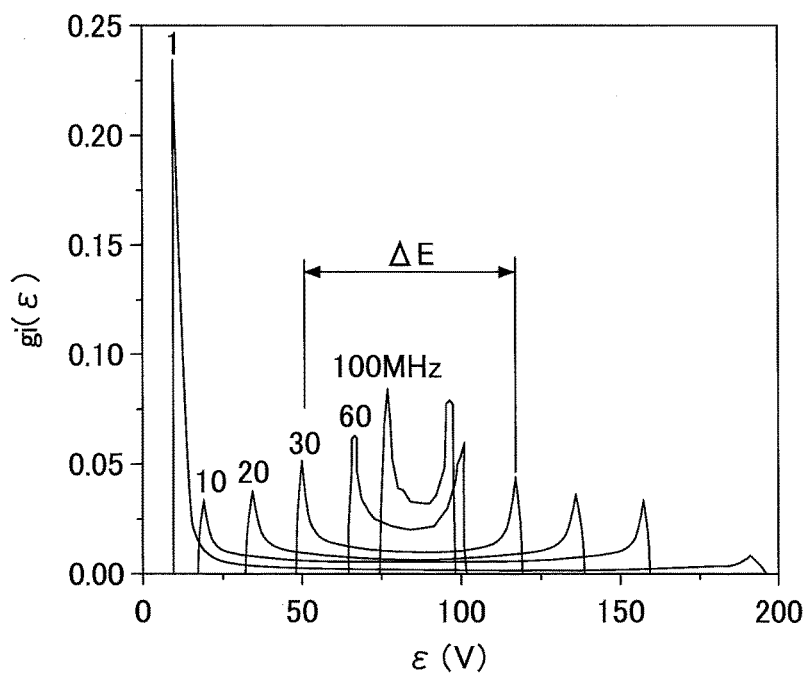
FIG. 16A is a graph showing a frequency dependency of an energy distribution of ions reaching a wafer.

In "Principles of Plasma Discharges and Material Processing" ($2^{nd}$ edition, Michael A. Lieberman & Allan J. Lichtenberg, Maruzen, pp. 351 to 356), there is described a frequency dependency of an ion energy distribution in a helium (He) discharge when a high frequency power of a certain frequency is applied to a lower electrode, as depicted in FIG. 16A. In this book, it is described that a width ($\Delta E$) indicating diffusion of an ion energy distribution (IED) is widened as a frequency is decreased, whereas the width (SE) is sharply narrowed as the frequency is increased.

Figure 16B:
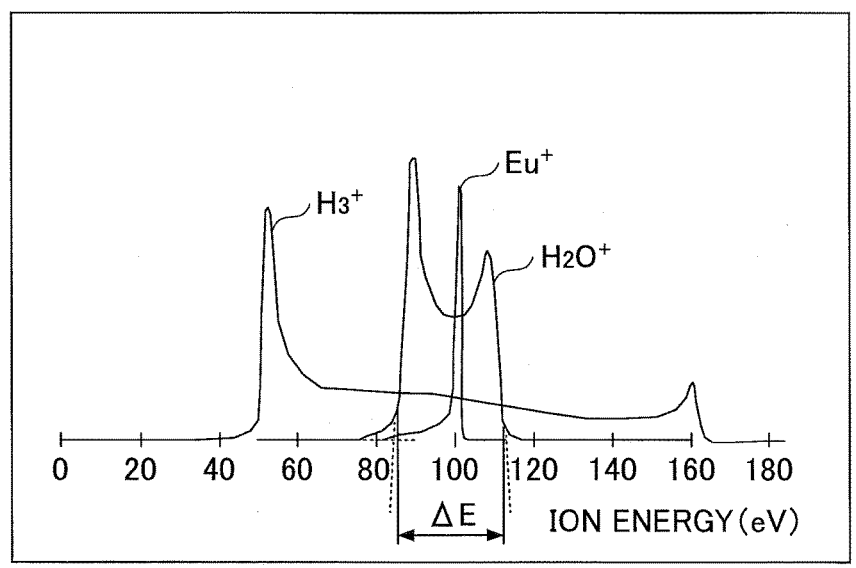
FIG. 16B is a graph showing a difference in ion energy distributions depending on ion types.

Further, it is also described that the width ($\Delta E$) of the ion energy distribution (IED) is in inverse proportion to a square root of an ion mass. By way of example, FIG. 16B shows variations in ion energy distributions (IED) depending on kinds of ions when applying a high frequency power of 13.56 MHz. For example, in case of helium (He) (mass number: 4) and oxygen (O) (mass number: 16), a width ($\Delta E$) of the ion energy distribution (IED) of the oxygen (O) is half the width ($\Delta E$) of the ion energy distribution (IED) of the helium (He). Though the width ($\Delta E$) also depends on the high frequency power, an order of the sizes of the widths ($\Delta E$) between frequencies does not change. Specifically, referring to FIG. 16A, a width ($\Delta E$) of an ion energy distribution of 100 MHz is the narrowest and sharpest. As the frequency decreases, the size of the width ($\Delta E$) between frequencies is increased. Here, however, a width ($\Delta E$) of an ion energy distribution (IED) at a low frequency does not become narrower than a width ($\Delta E$) of an ion energy distribution (IED) at a high frequency.

Referring back to FIG. 16A, a width ($\Delta E$) (value in the document) of an ion energy distribution (IED) of helium (He) ions is calculated by referring to dependency of the ion energy distribution (IED) of helium (He) discharge upon a frequency of a high frequency power applied to a lower electrode. As shown in FIG. 16C, the width ($\Delta E$) is found to be 70 eV, 35 eV and 20 eV when the frequency is 30 MHz, 60 MHz and 100 MHz, respectively. That is, as the frequency increases, $\Delta E$ becomes narrowed to have a sharp distribution. Further, as stated above, based on the mass of ions, a width ($\Delta E$) of an ion energy distribution (IED) of oxygen (O) ion is half the width ($\Delta E$) of the ion energy distribution (IED) of the helium (He) ion. That is, as depicted in FIG. 16C, $\Delta E$ (calculated value) of the oxygen (O) ion is 35 eV at 30 MHz, 17.5 eV at 60 MHz and 10 eV at 100 MHz. As compared to the ion energy distribution (IED) of the helium (He) ion, the ion energy distribution (IED) of the oxygen (O) ion is sharper and has a narrower width $\Delta E$. In view of the fact that the width $\Delta E$ of the ion energy distribution (IED) decreases as the frequency of the high frequency power increases, it is expected that a frequency of a high frequency power for ion attraction that allows the oxygen (O) ion energy to range from 15 eV to 30 eV higher than or equal to 60 MHz. At a frequency lower than 60 MHz, the width ΔE of the ion energy distribution (IED) of the oxygen (O) ion is excessively widened and a required selectivity may not be obtained.

By way of example, the high frequency power dependency will be discussed with reference to FIG. 14(d) and FIG. 15. To investigate a power dependency of an ion energy distribution (IED) in a CCP processing apparatus of FIG. 14(d), a high frequency power having a frequency of 100 MHz is applied to a lower electrode (16). In this case, by increasing the power, an average energy may be altered without widening an energy distribution greatly.

Meanwhile, to investigate a power dependency of an ion energy distribution (IED) in an ICP processing apparatus of FIG. 15, a high frequency power is applied to an upper electrode. In this case, even if the power is increased, an incident energy on the wafer is not changed, and it is difficult to concentrate ion energy within the width of 15 eV to 30 eV.

Further, for the power dependency of the ion energy distribution (IED) in the ICP etching apparatus of FIG. 12, when applying a high frequency power to the upper electrode while applying a high frequency bias power having a frequency of 13 MHz to the susceptor 16, the width of the ion energy distribution (IED) is greatly widened, as compared to the case without applying the high frequency bias power. Especially, as the power increases, the width of the ion energy distribution (IED) is greatly widened. Accordingly, in the ICP processing apparatus, even if the high frequency bias power is applied to the susceptor 16, it is difficult to concentrate the ion energy within the width ranging from 15 eV to 30 eV.

Furthermore, for the ion energy distribution (IED) in the CCP processing apparatus of FIG. 13, ion energy distribution (IED) are shown for cases when applying the high frequency power of 100 MHz to the lower electrode (single frequency power to lower electrode) and the pressure is set to be 20 mT (2.66644 Pa) and 50 mT (6.6661 Pa). In these two different cases, however, there is no great difference in the shape of the ion energy distribution (IED). This result shows that the pressure hardly has an effect in concentrating the ion energy within the width from 15 eV to 30 eV.

As concluded from the above, it is understood that it is desirable to apply a high frequency power having an ion energy distribution (IED) where ion energy is within a range from 15 eV to 30 eV and having the ion energy distribution (IED) in a sharp shape when ions are attracted to the wafer. Further, it is understood that the frequency of the high frequency power needs to be higher than or equal to 60 MHz in order to allow the ion energy distribution (IED) where the ion energy is concentrated within a width of 15 eV ranging from 15 eV to 30 eV. In addition, it is desirable to apply the high frequency power having a frequency higher than or equal to 60 MHz to a lower electrode (16) of a CCP processing apparatus. Further, such a high frequency may be supplied from the first high frequency power supply 36.

As described above, the etching method in accordance with the present embodiment is directed to a method of etching a periodic pattern formed by self-assembly of a first polymer and a second polymer contained in a block copolymer that can be self-assembled. As an etching condition, a frequency of a high frequency power applied to an electrode from a high frequency power supply is adjusted. Specifically, the frequency of the high frequency power supply is set such that a great amount of ion energy is distributed in a range smaller than the ion energy distribution $E_2$ at which an etching yield of the polystyrene PS as an example of the first polymer is generated and larger than or equal to the ion energy $E_1$ at which an etching yield of the methyl methacrylate PMMA as an example of the second polymer is generated. The high frequency power having the frequency within this range is supplied into the processing chamber (chamber 10) from the high frequency power supply. Plasma is generated from a gas introduced into the processing chamber by applying the high frequency power, and a periodic pattern (polymer layer 120 in FIG. 7) on the base film mounted on the mounting table (susceptor 16) is etched by the generated plasma. In this way, by applying the high frequency power having the ion energy ranging from 15 eV to 30 eV, the methyl methacrylate PMMA can be etched with a high selectivity by attracting ions in the plasma and a fine pattern of the polystyrene PS can be formed.

As can be seen from the above, it is desirable to supply a high frequency power of a frequency higher than or equal to 60 MHz into the processing chamber from the high frequency power supply. Further, it is more desirable to supply a high frequency power of a frequency that allows the ion energy to be distributed within a range from 15 eV to 30 eV into the processing chamber from the high frequency power supply. Further, it is desirable to apply such a high frequency power to the lower electrode.

As explained above, according to the present embodiment, in the self-assembled periodic pattern including the fine structure of the first polymer A and the second polymer B, the following control can be performed in order to form a fine mask pattern of the first polymer A by electively etching the second polymer B.

First, a material capable of being etched at an ion energy distribution having a lower energy value at which the first polymer A is not etched is selected as the second polymer B. Further, the etching condition for the second polymer B may be set such that the ion energy distribution becomes more than or equal to the energy value at which the second polymer B is appropriately etched and less than or equal to the energy value at which the etching selectivity between the second polymer B and the first polymer A is sufficient. Specifically, the etching condition may be appropriately adjusted to obtain the ion distribution characteristic in which the ion distribution falls within an ion energy region between the ion energy values E1 to Et in FIG. 4.

The ion distribution may be, for example, more than or equal to 15 eV. With this, the etching rate of the second polymer B can be made relatively higher so that the influence of narrowing the CD can be reduced. Further, the ion distribution may be, for example, less than or equal to 30 eV. With this, the etching of the first polymer A can be prevented sot that the second polymer B can be selectively etched.

Further, the ion energy value of the high frequency power can be set within a desired range by controlling whether to apply the high frequency power the upper electrode 48 and the lower electrode (16), the frequency or the power of the high frequency power to be applied, or the like.

For example, the frequency of the high frequency power applied to the lower electrode (16) may be more than or equal to 60 MHz. Further, by controlling the power of the frequency of the high frequency power applied to the lower electrode (16), it is possible to set a desired ion energy value.

The controller 88 is capable of controlling application of the high frequency powers of a predetermined frequency and power to the lower electrode (16) and the upper electrode 48 by controlling the first high frequency power supply 36, the second high frequency power supply 38, the third high frequency power supply 66, and/or the DC controller 83 in accordance with various types of recipes.

<Materials of First Polymer A and Second Polymer B>

The first polymer A and the second polymer B of the block copolymer that can be self-assembled are two different kinds of organic polymers. By removing the second polymer B through etching, a pattern of the first polymer A is formed. The first polymer A and the second polymer B is not limited to polystyrene PS and methyl methacrylate PMMA as mentioned in the present embodiment. By way of example, for Directed Self-assembled process DSA, PS-b-PMMA, which is a diblock copolymer of polystyrene PS and methyl methacrylate PMMA may be used. Besides, a chain block copolymer or a block copolymer having other structures, such as a star copolymer, a branched copolymer, a hyperbranched copolymer and a graft copolymer, may also be used.

A block may be formed of various kinds of monomers that can be polymerized. Here, the block may be, but not limited to, polyolefin including polydiene, polyether including poly (alkylene oxide) (e.g., poly (ethylene oxide), poly (propylene oxide), poly (butylene oxide), or a random combination or block copolymer thereof), poly ((meta) acrylate), polystyrene, polyester, polyorgano siloxane, polyorgano germane, or the like.

A block of a block copolymer may be a monomer, and may include $C_{2-30}$ olefin monomer, $C_{1-30}$ alcohol-originated (meta) acrylate monomer, an inorganic component containing monomer having Fe, Si, Ge, Sn, Al and Ti as a base, or a combination including at least one of the mentioned monomers. By way of non-limiting example, a monomer used in the block may be, as a $C_{2-30}$ olefin monomer, ethylene, propylene, 1-buthene, 1,3-butadiene, isoprene, vinyl acetate, dihydropyran, nobornene, maleic anhydride, styrene, 4-hydroxystyrene, 4-acetoxystyrene, 4-methylstyrene or α-methylstyrene. Further, a monomer, as a (meta) acrylate monomer, may be, but not limited to, methyl (meta) acrylate, ethyl (meta) acrylate, n-propyl (meta) acrylate, isopropyl (meta) acrylate, n-butyl (meta) acrylate, isobutyl (meta) acrylate, n-pentyl (meta) acrylate, isopentyl (meta) acrylate, neopentyl (meta) acrylate, n-hexyl (meta) acrylate, cyclohexyl (meta) acrylate, isobonyl (meta) acrylate, hydroxyethyl (meta) acrylate, or the like. Combinations of two or more of these monomers may be used. A homopolymer block may include a block formed by using styrene (e.g., a polystyrene block) or (meta) acrylate homopolymer block such as poly (methyl metacrylate). A random block may include, for example, a block of randomly polymerized styrene and methyl metacrylate (e.g., poly (styrene-co-methyl metacrylate)). The alternative copolymer block may include a block of styrene and maleic anhydride. Under most of conditions, maleic anhydride cannot be homo-polymerized. Accordingly, it is known to form a structure (e.g., poly (styrene-alt-maleic anhydride) in which two molecules of styrene and maleic anhydride are repeated. These blocks are nothing more than examples, and the embodiment may not be limited thereto.

Further, the block copolymer that can be appropriately used in the present method may include, but not limited to, poly (styrene-b-vinylpyridine), poly (styrene-b-butadiene), poly (styrene-b-isoprene), poly (styrene-b-methyl metacrylate), poly (styrene-b-alkenyl aromatic), poly (isoprene-b-ethylene oxide), poly (styrene-b-(ethylene-propylene), poly (ethylene oxide-b-caprolactone), poly (butadiene-b-ethylene oxide), poly (styrene-b-t-butyl (meta) acrylate), poly (methyl metacrylate-b-t-butyl metacrylate), poly (ethylene oxide-b-propylene oxide), poly (styrene-b-tetrahydrofuran), poly (styrene-b-isoprene-b-ethylene oxide), poly (styrene-b-dimethylsiloxane), poly (methyl metacrylate-b-dimethylsiloxane) or a diblock- or triblock copolymer of a combination including at least one of the aforementioned block copolymers.

It may be desirable that a block copolymer has an overall molecular weight and a polydispersity suitable for performing a further process. By way of non-limiting example, the block copolymer may have a weight average molecular weight ($M_w$) ranging from about 3,000 g/mol to 400,000 g/mol. The block copolymer may have a number average molecular weight ($M_n$) ranging from 1,000 to 200,000. The block copolymer may also have a polydispersity ($M_w/M_n$) ranging from 1.01 to 6, but not limited thereto. By way of example, the two molecular weights $M_w$ and $M_n$ may be determined by using a universal correction method by which the molecular weights are corrected with respect to polystyrene standard based on a gel permeation chromatography.

In accordance with the embodiments as described above, it is possible to optimize etching conditions for the periodic pattern formed by the self-assembly of the block copolymer.

While various aspects and embodiments have been described herein, other aspects and embodiments will be apparent to those skilled in the art. The various aspects and embodiments described herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

Further, the apparatus capable of performing the etching method of the present embodiment may not be limited to a capacitively coupled plasma etching apparatus that applies dual frequency powers to a lower electrode and applies a single frequency power to an upper electrode. By way of example, a capacitively coupled plasma etching apparatus that applies a single frequency power or dual or more frequency powers to a lower electrode may be used.

Furthermore, a gas used in the etching of the embodiment may not necessarily be an oxygen-containing gas, but other type of gases may be used. In such a case, the frequency may be appropriately adjusted so that the ion energy value of the high frequency power becomes within a desired range.

What is claimed is:

1. An etching apparatus comprising:
a processing chamber;
a mounting table configured as a lower electrode and placed in the processing chamber;
a high frequency power supply configured to supply a high frequency power to the mounting table;
a gas supply source configured to supply a predetermined gas into the processing chamber; and
a controller configured to control the etching apparatus such that the etching apparatus performs a method that includes the following steps:
receiving a structure including a base layer and a polymer layer formed on the base layer on the mounting table, the polymer layer of the received structure having a periodic pattern of a first polymer and a second polymer formed by self-assembling the first polymer and the second polymer of a block copolymer that is capable of being self-assembled,
etching the polymer layer of the received structure such that the second polymer is removed and a pattern of the first polymer is formed so that the pattern of the first polymer is used for subsequently etching the base layer as a mask, wherein the step of etching the polymer layer includes:
supplying a high frequency power that causes a great amount of ion energy to be distributed within a range smaller than ion energy distribution at which an etching yield of the first polymer is generated and larger than or equal to ion energy distribution at which an etching yield of the second polymer is generated, by setting the frequency of the high frequency power to be higher than or equal to 60 MHz, to the mounting table by the high frequency power supply, and
supplying a predetermined gas by the gas supply source, generating plasma from the supplied gas by the high frequency power, and etching the polymer layer using the generated plasma.

2. The etching apparatus of claim 1,
wherein the first polymer and the second polymer are two different kinds of organic polymers.

3. The etching apparatus of claim 2,
wherein the first polymer is polystyrene, and the second polymer is methyl metacrylate.

4. The etching apparatus of claim 1,
wherein the mounting table is provided in a processing chamber of a parallel plate type plasma processing apparatus in which the lower electrode and an upper electrode are spaced apart from each other.

5. The etching apparatus of claim 1,
wherein the high frequency power is set such that a great amount of ion energy is distributed within a range greater than or equal to 15 eV.

6. The etching apparatus of claim 1,
wherein the high frequency power is set such that a great amount of ion energy is distributed within a range smaller than or equal to 30 eV.

7. The etching apparatus of claim 1,
wherein the high frequency power supplied from the high frequency power is a single frequency.

8. The etching apparatus of claim 1,
wherein the predetermined gas includes an oxygen atom.

* * * * *